(12) United States Patent
Lei et al.

(10) Patent No.: US 8,116,341 B2
(45) Date of Patent: Feb. 14, 2012

(54) MULTIPLE LASER WAVELENGTH AND PULSE WIDTH PROCESS DRILLING

(75) Inventors: Weisheng Lei, Portland, OR (US); Yunlong Sun, Beaverton, OR (US); Yasu Osako, Lake Oswego, OR (US); John Davignon, Hillsboro, OR (US); Glenn Simenson, Portland, OR (US); Hisashi Matsumoto, Hillsboro, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 1206 days.

(21) Appl. No.: 11/756,507

(22) Filed: May 31, 2007

(65) Prior Publication Data

US 2008/0296272 A1 Dec. 4, 2008

(51) Int. Cl.
*H01S 3/109* (2006.01)
*H01S 3/10* (2006.01)
*B23K 26/38* (2006.01)

(52) U.S. Cl. .................. 372/22; 219/121.71; 372/23

(58) Field of Classification Search .............. 372/22, 372/23, 12, 27; 219/121.7, 121.71, 121.77, 219/121.68, 121.69
See application file for complete search history.

(56) References Cited

U.S. PATENT DOCUMENTS

| | | | | |
|---|---|---|---|---|
| 5,166,493 A | * | 11/1992 | Inagawa et al. | 219/121.71 |
| 5,231,641 A | * | 7/1993 | Ortiz | 372/21 |
| 5,361,268 A | * | 11/1994 | Fossey et al. | 372/22 |
| 5,593,606 A | | 1/1997 | Owen et al. | |
| 5,656,186 A | | 8/1997 | Mourou et al. | |
| 5,841,099 A | | 11/1998 | Owen et al. | |
| 5,943,351 A | * | 8/1999 | Zhou et al. | 372/22 |
| 5,970,077 A | * | 10/1999 | Hill | 372/23 |
| 6,002,695 A | * | 12/1999 | Alfrey et al. | 372/22 |
| 6,229,829 B1 | * | 5/2001 | Yin | 372/22 |
| 6,574,250 B2 | | 6/2003 | Sun et al. | |
| 6,584,134 B2 | * | 6/2003 | Yin et al. | 372/22 |
| 6,734,387 B2 | * | 5/2004 | Kafka et al. | 219/121.68 |
| 6,784,399 B2 | | 8/2004 | Dunsky et al. | |
| 6,859,467 B2 | * | 2/2005 | Adams et al. | 372/22 |

(Continued)

FOREIGN PATENT DOCUMENTS

JP 8320456 A * 12/1996

(Continued)

OTHER PUBLICATIONS

Machine translation of Japan Patent No. 2005-161,330, Jan. 2011.*

(Continued)

*Primary Examiner* — Geoffrey S Evans
(74) *Attorney, Agent, or Firm* — Stoel Rives LLP

(57) ABSTRACT

Dual-beam laser outputs, preferably derived from a single laser beam, improve the quality of the sidewalls of vias drilled in a target material, such as printed circuit board, comprising fiber-reinforced resin. Two embodiments each use two laser output components to remove a portion of target material from a target material location of a workpiece and rapidly clean remnants of the target material bonded to a metal layer underlying the target material location at a material removal rate. A first embodiment entails directing for incidence on a portion of the target material at the target material location a processing laser output having first and second components characterized by respective first and second wavelengths. A second embodiment entails directing for incidence on a portion of the target material at the target material location a processing laser output having first and second components characterized by respective first and pulse widths.

11 Claims, 14 Drawing Sheets

U.S. PATENT DOCUMENTS

| | | | |
|---|---|---|---|
| 7,605,343 B2* | 10/2009 | Lei et al. | 219/121.71 |
| 2002/0021723 A1* | 2/2002 | Amako et al. | 372/23 |
| 2002/0080841 A1* | 6/2002 | Yin et al. | 372/75 |
| 2002/0092833 A1* | 7/2002 | Lipman et al. | 219/121.7 |
| 2003/0035448 A1* | 2/2003 | Yin | 372/22 |
| 2003/0141288 A1 | 7/2003 | Mayer | |
| 2003/0142703 A1* | 7/2003 | Gao et al. | 372/21 |
| 2005/0087522 A1 | 4/2005 | Sun et al. | |
| 2005/0247682 A1* | 11/2005 | Kuroiwa et al. | 219/121.73 |
| 2005/0254530 A1* | 11/2005 | Sun | 372/22 |
| 2006/0078013 A1* | 4/2006 | Chen | 372/22 |
| 2006/0126674 A1 | 6/2006 | Sun et al. | |
| 2006/0126677 A1 | 6/2006 | Sun et al. | |
| 2006/0126678 A1 | 6/2006 | Sun et al. | |
| 2006/0185474 A1 | 8/2006 | Yamada et al. | |
| 2007/0070484 A1* | 3/2007 | Nagano et al. | 359/238 |
| 2008/0008215 A1* | 1/2008 | Park | 372/22 |
| 2008/0259969 A1* | 10/2008 | Piper et al. | 372/21 |
| 2009/0244516 A1* | 10/2009 | Mehendale et al. | 356/33 |

FOREIGN PATENT DOCUMENTS

| | | | |
|---|---|---|---|
| JP | 2000-202664 | * | 7/2000 |
| JP | 2000-343261 A | | 12/2000 |
| JP | 2005-161330 A | * | 6/2005 |
| JP | 2005-313195 A | | 11/2005 |
| JP | 2006-8750 A | * | 1/2006 |

OTHER PUBLICATIONS

Machine translation of Japan Patent No. 08-320,456, Jan. 2011.*

* cited by examiner

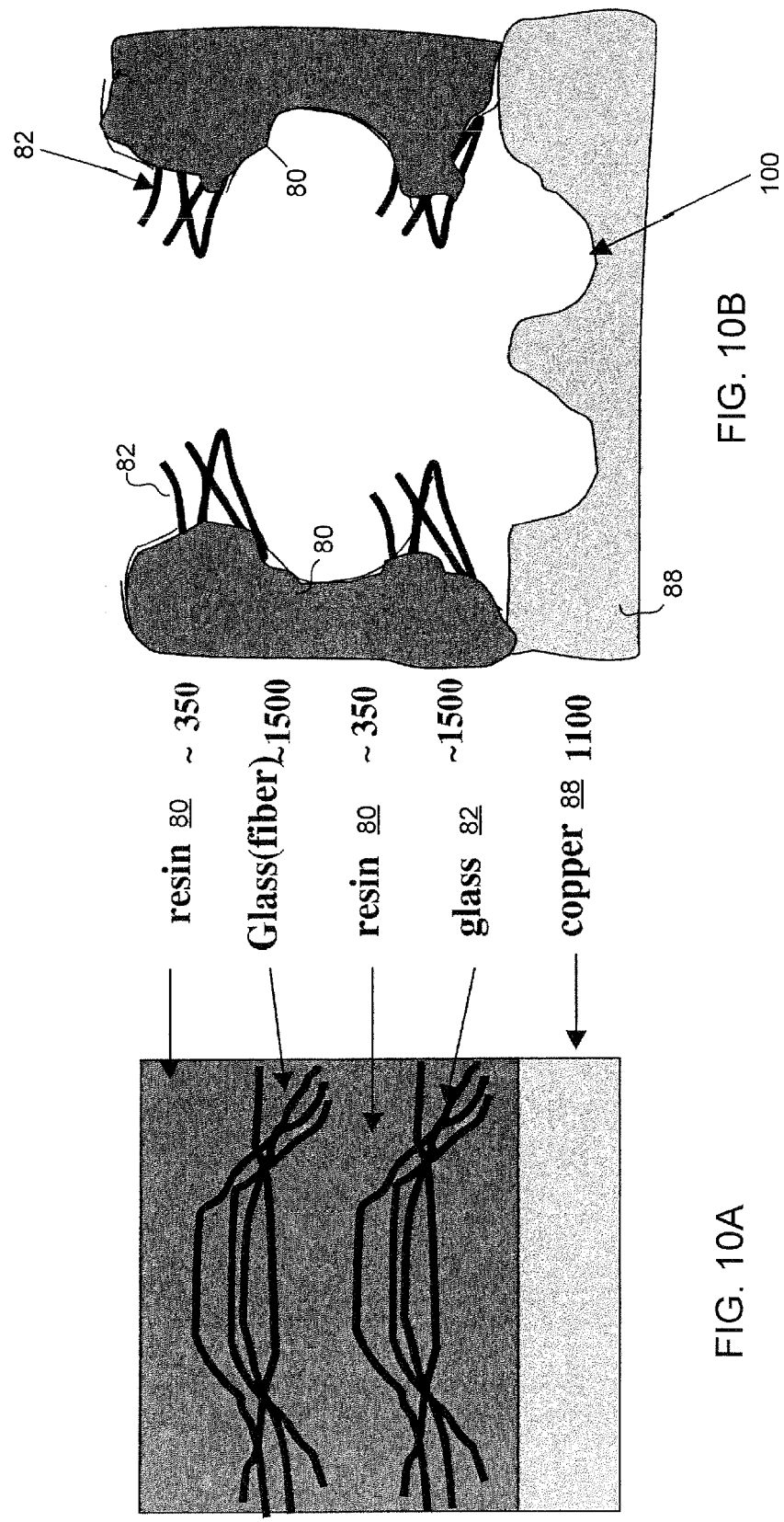

MULTIPLE LASER WAVELENGTH AND PULSE WIDTH PROCESS DRILLING

TECHNICAL FIELD

The present disclosure relates to increased quality and efficiency in laser processing and, more specifically, to use of a laser beam having one or both of multiple wavelengths and varying pulse widths to increase via drilling throughput or quality.

BACKGROUND INFORMATION

Laser processing can be conducted on numerous different workpieces using various lasers effecting a variety of processes. The specific types of laser processing of primary interest are laser processing of a single or multilayer workpiece to effect through-hole or blind via formation.

U.S. Pat. Nos. 5,593,606 and 5,841,099 to Owen et al. describe methods of operating an ultraviolet (UV) laser system to generate laser output pulses characterized by pulse parameters set to form in a multilayer device through-hole or blind vias in two or more layers of different material types. The laser system includes a nonexcimer laser that emits, at pulse repetition rates of greater than 200 Hz, laser output pulses having temporal pulse widths of less than 100 ns, spot areas having diameters of less than 100 µm, and average intensities or irradiance of greater than 100 mW over the spot area. A typical nonexcimer UV laser used includes a diode-pumped, solid-state (DPSS) laser.

U.S. Pat. No. 6,784,399 to Dunsky et al. describes a method of operating a pulsed $CO_2$ laser system to generate laser output pulses that form blind vias in a dielectric layer of a multilayer device. The laser system emits, at pulse repetition rates of greater than 200 Hz, laser output pulses having temporal pulse widths of less than 200 ns and spot areas having diameters of between 50 µm and 300 µm. The above-identified patents to Owen et al. and to Dunsky et al. are assigned to the assignee of this patent application.

Laser ablation of a target material, particularly when a UV DPSS laser is used, relies upon directing to the target material a laser output having a fluence or energy density that is greater than the ablation threshold of the target material. A UV laser emits laser output that can be focused to have a spot size of between about 10 µm and about 30 µm at the $1/e^2$ diameter. In certain instances, this spot size is smaller than the desired via diameter, such as when the desired via diameter is between about 50 µm and 300 µm. The diameter of the spot size can be enlarged to have the same diameter as the desired diameter of the via, but this enlargement reduces the energy density of the laser output such that it is less than the ablation threshold of the target material and cannot effect target material removal. Consequently, the 10 µm to 30 µm focused spot size is used and the focused laser output is typically moved in a spiral, concentric circular, or "trepan" pattern to form a via having the desired diameter. Spiraling, trepanning, and concentric circle processing are types of so-called non-punching via formation processes. For via diameters of about 50 µm or smaller, direct punching delivers a higher via formation throughput.

In contrast, the output of a pulsed $CO_2$ laser is typically larger than 50 µm and capable of maintaining an energy density sufficient to effect formation of vias having diameters of 50 µm or larger on conventional target materials. Consequently, a punching process is typically employed when using a $CO_2$ laser to effect via formation. However, a via having a spot area diameter of less than 45 µm is difficult to achieve with a $CO_2$ laser.

The high degree of reflectivity of copper at the $CO_2$ wavelength makes very difficult the use of a $CO_2$ laser in forming a through-hole via in a copper sheet having a thickness of greater than about 5 microns. Thus, $CO_2$ lasers are typically used to form through-hole vias only in copper sheets having thicknesses that are between about 3 microns and about 5 microns, or that have been surface treated to enhance the absorption of the $CO_2$ laser energy.

The most common materials used in making multilayer structures for printed circuit board (PCB) and electronic packaging devices in which vias are formed typically include metals (e.g., copper) and dielectric materials (e.g., polymer polyimide, resin, or FR-4). Laser energy at UV wavelengths exhibits good coupling efficiency with metals and dielectric materials, so the UV laser can readily effect via formation on copper sheets and dielectric materials. Also, UV laser processing of polymer materials is widely considered to be a combined photo-chemical and photo-thermal process, in which the UV laser output partly ablates the polymer material by disassociating its molecular bonds through a photon-excited chemical reaction, thereby producing superior process quality as compared to the photo-thermal process that occurs when the dielectric materials are exposed to longer laser wavelengths.

$CO_2$ laser processing of dielectric and metal materials and UV laser processing of metals are primarily photo-thermal processes, in which the dielectric material or metal material absorbs the laser energy, causing the material to increase in temperature; decompose, soften, or become molten; and eventually ablate, vaporize, or blow away. Ablation rate and via formation throughput, are, for a given type of material, functions of laser energy density (laser energy (J) divided by spot size ($cm^2$)), power density (laser energy (J) divided by spot size ($cm^2$) divided by pulse width (seconds)), laser wavelength, and pulse repetition rate. When punching micro-vias (usually less than 150 µm), to get the best quality, typically a laser beam needs to be converted from a Gaussian beam profile into a "top-hat" or flattened beam profile.

Thus, laser processing throughput, such as, for example, via formation on a PCB or other electronic packaging devices, or hole drilling on metals or other materials, is limited by the laser power intensity available and pulse repetition rate, as well as the speed at which the beam positioner can move the laser output in a spiral, concentric circle, or trepan pattern and between via positions. An example of a UV DPSS laser is a Model Q302 (355 nm) sold by JDSU (JDS Uniphase Corporation), San Jose, Calif. This laser is used in a Model 5330 laser system or other systems in its series manufactured by Electro-Scientific Industries, Inc., Portland, Oreg., the assignee of the present patent application. The laser is capable of delivering 8 W of UV power at a pulse repetition rate of 30 kHz. The typical via formation throughput of this laser and system is about 600 vias each second on bare resin. An example of a pulsed $CO_2$ laser is a Model Q3000 (9.3 µm) sold by Coherent-DEOS, Bloomfield, Conn. This laser is used in a Model 5385 laser system or other systems in its series manufactured by Electro-Scientific Industries, Inc. The laser is capable of delivering 18 W of laser power at a pulse repetition rate of 60 kHz. The typical via formation throughput of this laser and system is about 900 vias each second on bare resin and 200-300 vias each second on FR-4.

Increased via formation throughput could be accomplished by increasing the laser energy per pulse and the pulse repetition rate. However, for the UV DPSS laser and the pulsed $CO_2$ laser, there are practical problems stemming from the amounts by which the laser energy per pulse and the pulse repetition rate can be increased. Moreover, as laser energy per pulse increases, the risk of damage to the optical components inside and outside the laser resonator increases. Repairing damage to these optical components is especially time-consuming and expensive. Additionally, lasers capable of operating at a high laser energy per pulse or a high pulse repetition rate are often prohibitively expensive.

Fiber lasers are more recently being used to provide processing laser outputs because they provide high energy density and beam quality, along with integrated methods of amplification that aid in focusing the energy onto a target material to execute via drilling. A basic fiber laser may include a single mode core made of a laser material, e.g., doped with a laser ion such as neodymium, erbium, terbium or praseodymium, to provide an active galin medium. The fiber laser may further include a concentrically surrounding multi-mode fiber core and clad to define a pump cavity for the single mode core. (In the alternative, a separate fiber may run parallel to the single mode core to provide the pump source.) The indices of refraction of these three layers (single mode core, multi-mode core, and clad) are chosen so that pumping radiation delivered into one end of the fiber will be totally internally reflected at the interface between core and clad and propagate along the fiber.

The pumping radiation passes many times through the core of the laser material to provide effective coupling of the pumping radiation to the laser gain medium. However, the total reflection of the pumping radiation at the interface between the single mode and the multi-mode cores is such that the laser radiation is trapped within and propagates along the single mode core, thus providing a high-energy pumped, high-quality laser beam. The fiber may be placed between reflectors, such as mirrors, to define a resonant cavity to produce a laser beam of a particular resonant wavelength. As with the other lasers discussed herein, fiber lasers may incorporate optical train elements to process a fundamental wavelength of laser light into various harmonic wavelengths, and/or to adjust other parameters, such as pulse width and energy density.

SUMMARY OF THE DISCLOSURE

Embodiments of multiple output laser processing systems may be employed to speed up, or improve throughput of, image beam drilling to form blind vias. Specifically, dual-beam laser outputs at different wavelengths may be used. Use of dual-beam laser outputs also improves the quality of the sidewalls of vias drilled in a target material, such as printed circuit board, comprising fiber-reinforced resin.

Two embodiments are methods of using a laser output of such a system to remove a portion of target material from a target material location of a workpiece and rapidly clean remnants of the target material bonded to a metal layer underlying the target material location at a material removal rate.

One method entails directing for incidence on a portion of the target material at the target material location a processing laser output having first and second components characterized by respective first and second wavelengths. The first wavelength is appropriate to effect removal of the portion of the target material and clean remnants of the target material from the underlying metal layer. The second wavelength is sufficiently transmissive to the target material to pass therethrough and is sufficiently absorptive by the underlying metal layer to raise the temperature of the metal layer, during removal of the portion of the target material, to a level that allows the metal layer to be cleaned of the remnants at a material removal rate higher than a material removal rate achievable by the first component at the first wavelength in the absence of the second component at the second wavelength.

A second method entails directing along a beam axis a first processing laser output for incidence on a portion of the target material at the target material location. The first processing laser output is characterized by a first pulse width and a wavelength that is appropriate to effect removal of the portion of the target material. The second method also entails directing along the beam axis a second processing laser output for incidence on the portion of the target material at the target material location. The second processing laser output is characterized by a second pulse width that is shorter than the first pulse width and by a peak power that is sufficiently high to raise the temperature of the underlying metal layer at a rate faster than that which would be achievable by the first processing laser output. The result is to clean the remnants from the metal layer at a material removal rate higher than a material removal rate achievable by the first processing laser output in the absence of the second processing laser output.

A third embodiment is a method of using a laser output to remove a portion of a first metal layer at a target material location and to remove a portion of an underlying dielectric layer of fiber-reinforced resin at the target material location so as to increase the process quality of sidewalls created in the dielectric layer.

This third method entails directing along a beam axis a first processing laser output for incidence on a portion of a first metal layer at the target material location. The first processing laser output is characterized by a first wavelength that is appropriate to remove the portion of the first metal layer. The third method also entails directing along the beam axis a second processing laser output for incidence on a portion of a dielectric layer at the target material location. The second processing laser output is characterized by a second wavelength that is appropriate to remove the fiber-reinforced resin of which the fiber absorbs substantially more light at the second wavelength than at the first wavelength. The result is to reduce residual fiber protrusions in the sidewalls of the dielectric layer at the target material location that are otherwise present when the portion of the dielectric layer is removed with the first processing laser output at the first wavelength.

BRIEF DESCRIPTION OF THE DRAWINGS

FIGS. 10A and 10B show diagrammatic depictions of fiber-reinforced resin before and after, respectively, incidence of a laser beam at a 355 nm wavelength to form a blind via.

DETAILED DESCRIPTION OF PREFERRED EMBODIMENTS

Figure 1:
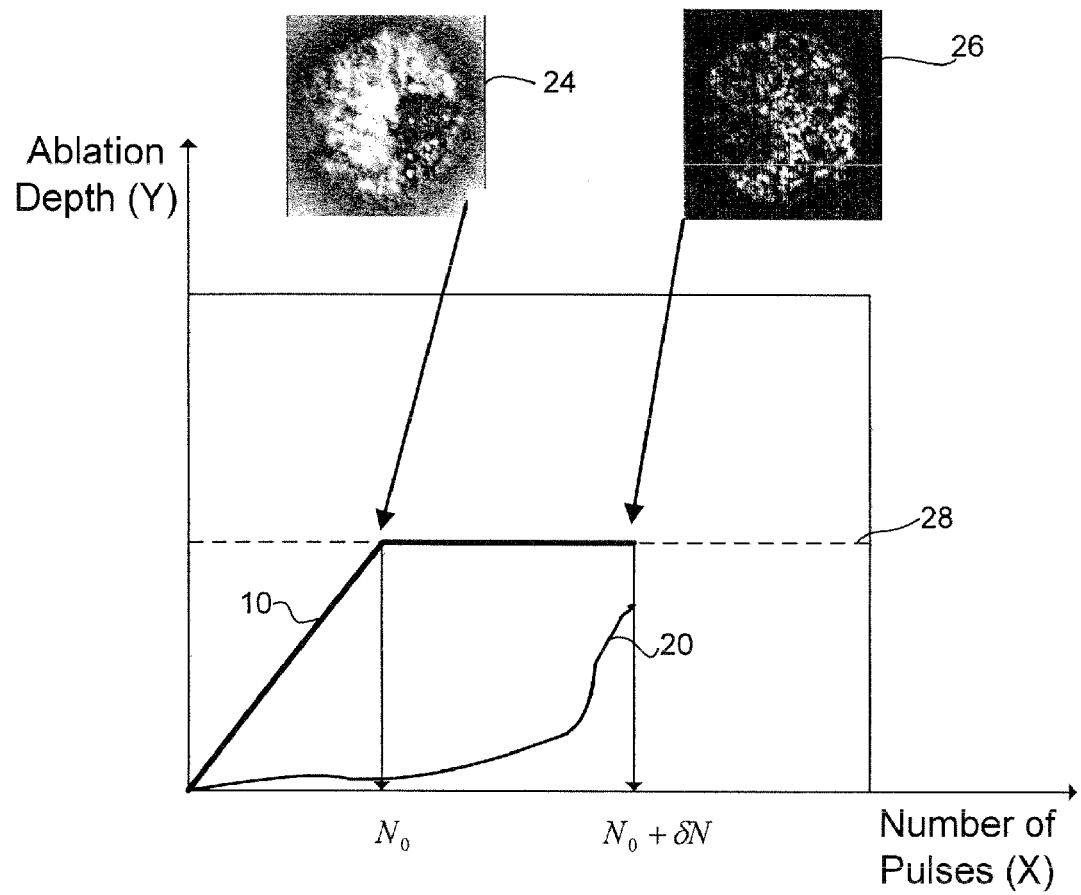
FIG. 1 shows a combined graph and pictorial images having overlaid thereon a temperature curve of a metal bottom of a blind via being drilled, in which the graph shows progress of imaged beam drilling according to ablation depth over a number of pulses $N_0$ and $\delta N$, and the pictorial images depict the degree of cleanliness of the metal.
Figure 2:
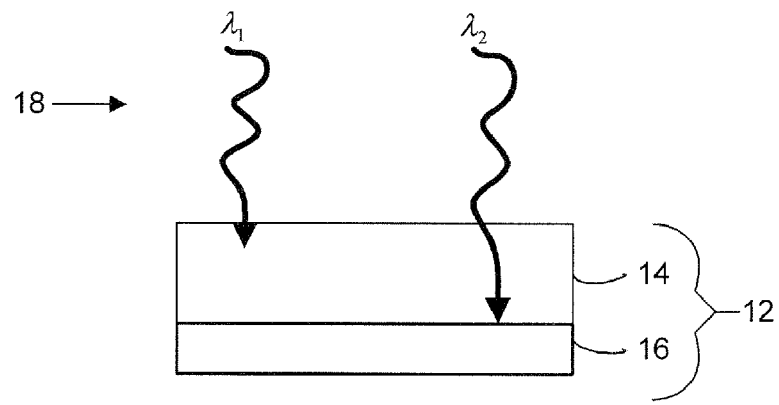
FIG. 2 shows a diagram of a multi-level target material having incident thereon components of a single, hybrid laser beam comprised of two wavelengths used to process the multi-level target material.

FIG. 1 shows a typical ablation depth response 10 to imaged beam drilling of a multilayer target material 12 shown in FIG. 2, in which target material 12 includes a dielectric or resin material 14 that is removed by a number of laser pulses $N_0$, and a layer of metal 16 underlying dielectric or resin material 14 that is cleaned by punching with a further number of pulses $\delta N$ as metal layer 16 is heated. FIG. 2 also shows components of a hybrid laser beam 18 comprising two different wavelengths ($\lambda_1, \lambda_2$) that may be collimated into a single laser beam to process multilayer target material 12.

The X-axis of FIG. 1 corresponds to the number of pulses, and the Y-axis corresponds to ablation depth. A plot line 20 tracks the temperature of a surface of metal layer 16 to indicate that the rate of cleaning of the surface of metal layer 16 increases as its temperature increases. A via image 24 shows a blind via after bulk resin material 14 is removed, and a via image 26 shows the blind via after metal layer 16 has been cleaned, e.g., removal of remnants of bulk resin material 14 from underlying metal layer 16. Cleaning requires, therefore, heating of metal layer 16 to dissolve the bond between the remaining bulk resin material 14 and metal layer 16 after bulk resin removal.

A dashed line 28 indicates the ablation depth of bulk resin material 14, which may comprise a particle-reinforced ABF resin material. Solder mask ablation is often done by using a process that entails punching target material 12 with an imaged solid state UV laser beam at a given wavelength, typically 355 nm. In most cases, the UV laser pulse width is longer than 15 ns.

Normally, a single step punching process is adopted when using a shaped, imaged UV beam to laser drill a filled or homogenous resin material 14. Complete laser drilling of a blind via entails two mechanisms. The first mechanism entails removal of bulk resin material 14 by punching with a given number of pulses $N_0$. This bulk resin material 14 removal exposes an underlying metal layer 16. The second mechanism entails cleaning the surface of the underlying metal layer 16 (or metal pad) with a given number of pulses $\delta N$ to achieve a degree of cleanliness required by quality specifications. The number of pulses $\delta N$ used to clean the metal layer 16 may represent a significant portion of the total number of pulses required to complete the blind via. The total number of pulses required to drill the via may be represented by $N=N_0+\delta N$. Thus, both $N_0$ and $\delta N$ influence drill time for each via, which is defined by the ratio of N to a laser pulse repetition rate (or frequency), or "PRF". Bulk resin material 14 may be ABF or some other homogeneous resin (dielectric) material.

Because drilling a blind via entails two laser material interaction mechanisms, the parameters that may affect or control one mechanism may not affect or control the other. For instance, the efficiency of cleaning via bottom metal pad 16 depends significantly on how fast and how high the bottom metal pad surface temperature can be raised to overcome the interface bonding strength between bulk resin material 14 and metal pad 16. Therefore, choosing a single set of parameters may not optimize the whole process.

The term "hybrid" with reference to hybrid laser beam 18 means that at least two laser beam components having varying parameters, such as wavelengths $\lambda_1, \lambda_2$ propagate coaxially in a single laser beam, or are otherwise caused to propagate collinearly as a dual-beam output when used to drill target material 12. When drilling a blind via, underlying metal layer 16 comprises a metal pad. The metal layer 16 is typically of copper, but may be made of any metal.

The laser beam components that generate the two wavelengths $\lambda_1, \lambda_2$ may originate from a single laser beam (or laser resonator) that is split to be processed into dual-beams of different wavelengths, or may originate from separate laser beams of different wavelengths that are combined coaxially before the combined beam reaches the surface of target material 12. A first beam component at a first wavelength $\lambda_1$ may come from, for example, a UV or a $CO_2$ laser beam, which is especially good for removal of bulk resin material 14. A second beam component at a second wavelength $\lambda_2$ may come from, for example, infrared (IR) or green laser beams, which are generally highly transmissive to ABF and other resin materials 14.

Fiber lasers may generate either or both first and second beam components at respective first and second wavelengths $\lambda_1$, $\lambda_2$, the temporal pulse profiles of which may be programmed to assume a range of pulse shapes. Pulsed fiber lasers are subject to peak power limits to prevent an onset of undesirable nonlinear effects, such as stimulated Brillouin scattering and spectral broadening. The effective peak power limit varies as a function of the fiber type and design employed and the sensitivity to various parameters, such as spectral bandwidth and spatial mode quality. The effective peak power prior to the onset of undesirable effects is typically between about 500 W and about 5 KW.

Figure 3:
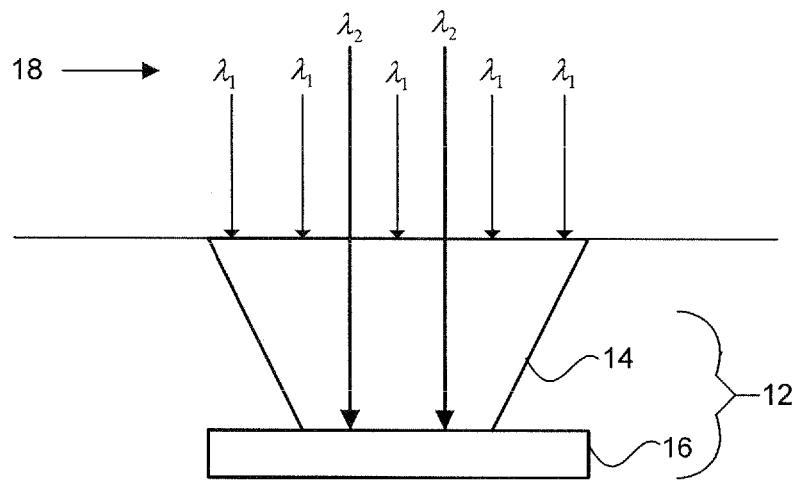
FIG. 3 shows a more detailed rendition of FIG. 2 in which one wavelength of the hybrid laser beam removes bulk resin dielectric material while another wavelength passes through the dielectric material and heats an underlying metal layer.

FIG. 3 shows a via spot in more detail, in which a hybrid processing beam 18 comprises first and second beam components characterized by respective first and second wavelengths $\lambda_1$, $\lambda_2$ to more efficiently drill a blind via. The first component at a first wavelength 4 is produced to remove bulk resin material 14, and the second component at a second wavelength $\lambda_2$ is produced to pass through bulk resin material 14 and heat underlying metal layer 16 while bulk resin material 14 is being removed by the first component. The first component at the first wavelength $\lambda_1$ is also characterized by additional parameters to effectively drill a via of a desired diameter. These parameters include beam spot size, an energy per pulse, a pulse width, and a pulse repetition rate, that, in combination, are appropriate for laser processing of target material 12, as previously discussed. First and second beam components at respective first and second wavelengths $\lambda_1$, $\lambda_2$ may also partly overlap each other spatially in lieu of producing a true, single dual-wavelength laser beam, or may be separate beams that are focused from non-collinear beam paths to the same target material location.

Figure 4:
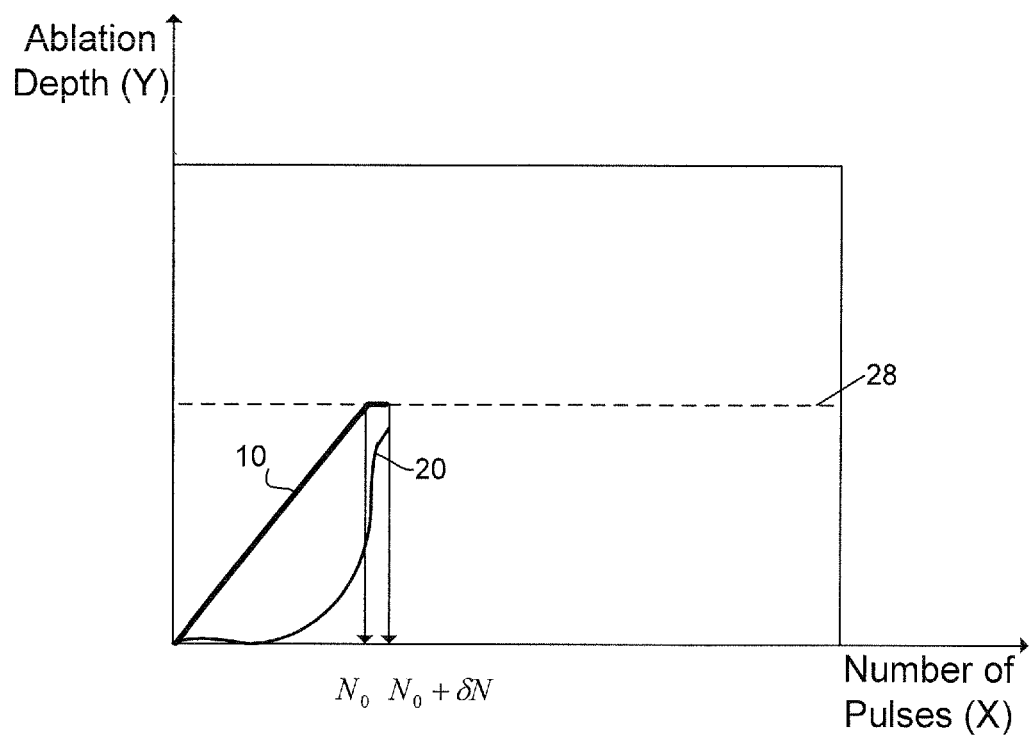
FIG. 4 shows improved speed of drilling a blind via by a laser beam of the same repetition rate as that of the laser beam in FIG. 1, because of the reduced number of pulses $\delta N$ required to clean the underlying metal layer.

FIG. 4 shows the improved speed of drilling a blind via when using the hybrid beam 18 of FIG. 3, quantifiable in a reduced number of pulses $\delta N$ (ideally zero) required to clean underlying metal layer 16. Because the wavelength $\lambda_2$ of infrared (IR) or green laser beams is transmissive to bulk resin material 14, wavelength $\lambda_2$ passes therethrough while wavelength $\lambda_1$ removes bulk resin material 14 and simultaneously begins to heat underlying metal pad 16. Wavelength $\lambda_2$ preferably, however, does not significantly heat bulk resin material 14 through which it passes. The ability to quickly heat up metal pad 16 accelerates the subsequent cleaning step, also executed by wavelength $\lambda_1$, thus decreasing the total number of pulses N required to drill the blind via. This occurs because the cleanliness of metal pad 16 is mainly determined by how fast the surface of metal pad 16 is heated. The in-situ heating effect of the second wavelength $\lambda_2$ significantly reduces the number of pulses N needed to create the blind via.

For instance, in one set of experiments, use of a UV-only process required 39 pulses to drill a blind via and clean the blind via bottom metal pad 16. Use of IR pre-processing to help heat metal pad 16 decreased the required number of pulses N to 21, which is a significant reduction. For purposes of the experiment, the UV beam propagated from a 1.18 W laser at a PRF of 30 kHz and produced a 58 µm imaged spot. The IR beam used to pre-process the via propagated from a 1 W laser at a PRF of 10 kHz with a focused spot size of 38 µm.

Hybrid laser beam 18 comprising beam components at wavelengths $\lambda_1$, $\lambda_2$ may pass through IORs (image optics rails) to be imaged and shaped and then delivered together to a target location of a work surface, or may be split into two laser beams before they both arrive at the target location.

UV laser generation at 355 nm is produced by third harmonic generation (THG) from a commercially available Nd:YVO$_4$ or Nd:YAG laser. In generation of the 355 nm wavelength UV beam, green and/or IR light is necessarily generated by the laser, a portion of which remains unconverted to the THG beam. The practice has been to discard the unconverted portions of the green or IR beams. Naturally, given the above use for the green or IR beams to decrease the number of pulses N required to drill a hole or via, retention and use of the green or IR beam becomes useful in the implementation of dual-wavelength laser processing beams.

The challenge is to coaxially align the two wavelengths $\lambda_1$, $\lambda_2$ to point them to the same targeted location, which is desired in via drilling. That is, because of wavelength differences, when the wavelengths $\lambda_1$, $\lambda_2$ are passed through the same dual-wavelength objective lens, they will be pointed to slightly different locations on processing material 12 (FIG. 2). One solution is to use two pairs of galvanometers (not shown), one pair each to independently control the beam placement onto the same target location. Thus, the beam direction of each wavelength $\lambda_1$, $\lambda_2$ is slightly altered before combination of the two wavelengths $\lambda_1$ and $\lambda_2$ into a hybrid beam that drills a single target material location.

Figure 5:
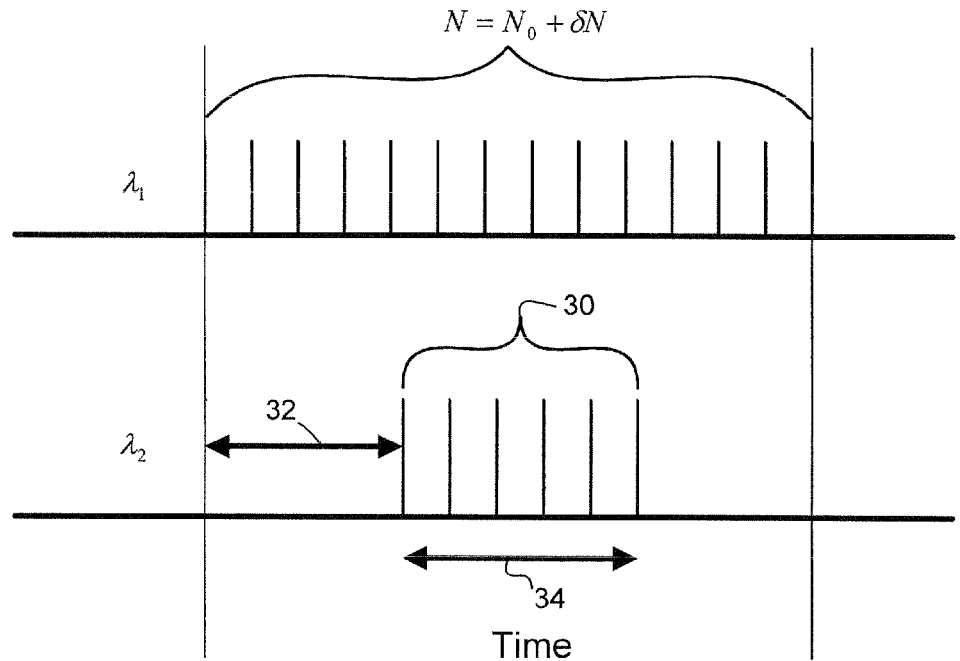
FIG. 5 shows a number N of pulses of a hybrid laser beam at a first wavelength to remove bulk resin material and clean an underlying metal layer throughout a process and fewer than N number of pulses of the hybrid laser beam at a second wavelength to heat the underlying metal layer during at least part of the process.

FIG. 5 shows the pulses generated by hybrid laser beam 18, in which bulk resin (or dielectric) layer 14 is removed throughout the process by a first beam component at wavelength $\lambda_1$ while underlying metal 16 is heated during part of the process by a second beam component at wavelength $\lambda_2$. Pulses denoted by N are the number of pulses required to drill a blind via, wherein $N_0$ is required to remove bulk resin material 14 and $\delta N$ is required to clean underlying metal layer 16 (or pad). Pulses denoted by 30 represent a required number of pulses of the second beam component at wavelength $\lambda_2$ for heating metal pad 16 to produce the favorable result shown in FIG. 4. The number of pulses 30 required will vary depending on the composition of the bulk resin material 14 and the strength of the bond between the bulk resin material 14 and underlying metal pad 16.

Through experimentation with certain laser sources and differing bulk resin materials 14 and metal layers 16, the time 32 during image drilling to begin pulsing the second beam component at wavelength $\lambda_2$ and the period of time 34 to pulse the second beam component may be determined for most favorable results. The second beam component may need to be pulsed for a subset of the period of time used for removing bulk resin material 14 with a particular number of pulses $N_0$, and may overlap into the time used for cleaning metal pad 16 with $\delta N$ pulses.

As an alternative to the above-described scheme, hybrid laser beam 18 may be generated that comprises multiple components with parameters that vary in addition to wavelength. For instance, a laser beam having a first wavelength $\lambda_1$ may be combined collinearly with another laser beam having a shorter pulse width and high enough peak power to clean the via bottom metal pad 16.

Figure 6:
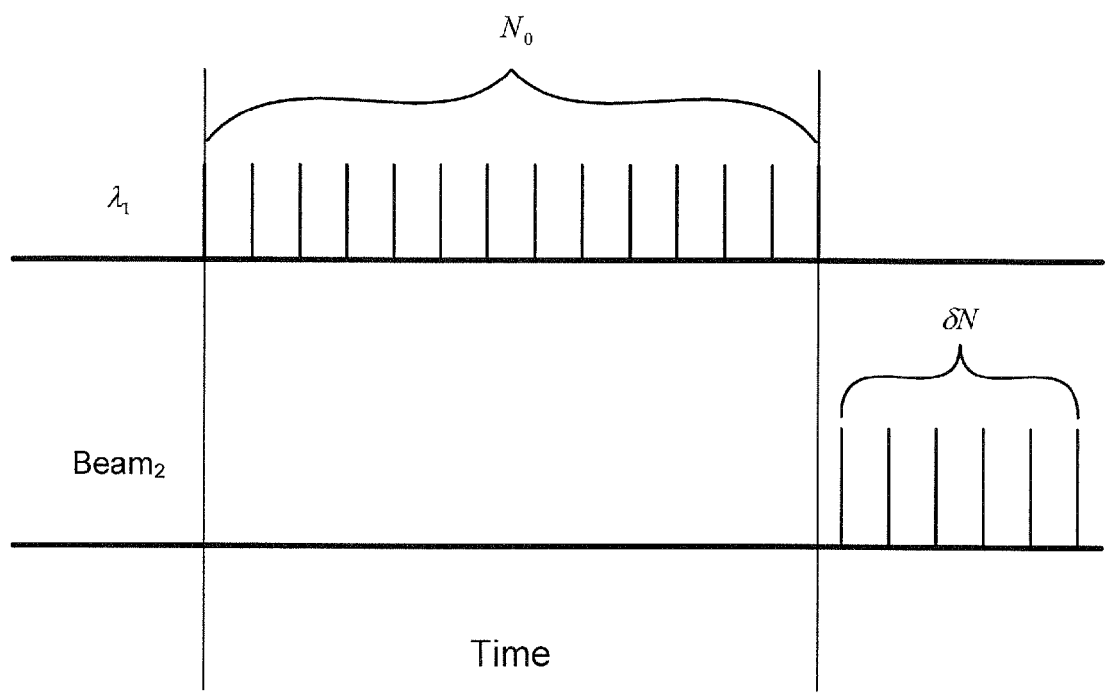
FIG. 6 shows a first series of laser pulses at a certain wavelength, e.g., in the UV range, propagating along a beam path to remove bulk resin material, followed by a second series of pulses propagating down the same beam path but having a shorter pulse width and higher peak power than those of the laser pulses in the first series to clean an underlying metal.

FIG. 6 shows a series of laser pulses $N_0$ at a certain wavelength $\lambda_1$, e.g., in the UV range, used for removing bulk resin material 14, followed by another series of pulses $\delta N$ (Beam$_2$) propagating along the same beam path and having a shorter pulse width and higher peak power to clean underlying metal layer 16. The higher peak power of Beam$_2$ indicates a laser beam of higher intensity. The shorter pulse width and higher peak power efficiently and relatively quickly raise the surface temperature of underlying metal layer 16, thus making for significantly faster via drill times. Faster drill times translate into an increase of throughput of drilling vias in a given time, e.g. the number of pulses δN required to clean metal pad 16 is decreased. Simultaneously, the risk of metal pad 16 delaminating from the substrate can also be greatly reduced.

In contrast with FIG. 5, an associated process presented in FIG. 6 indicates that the second laser, Beam$_2$, need be fired only when the via process reaches the bottom of a blind via, so the cost of using this laser is less than that of using a much higher powered traditional UV laser, for instance, to obtain the higher throughput. As such, the first and second laser beams may be generated from separate first and second laser sources. Additionally, the second processing laser output may comprise a wavelength shorter than about 1064 nm and a pulse width shorter than about 50 ns, for example.

Figure 7:
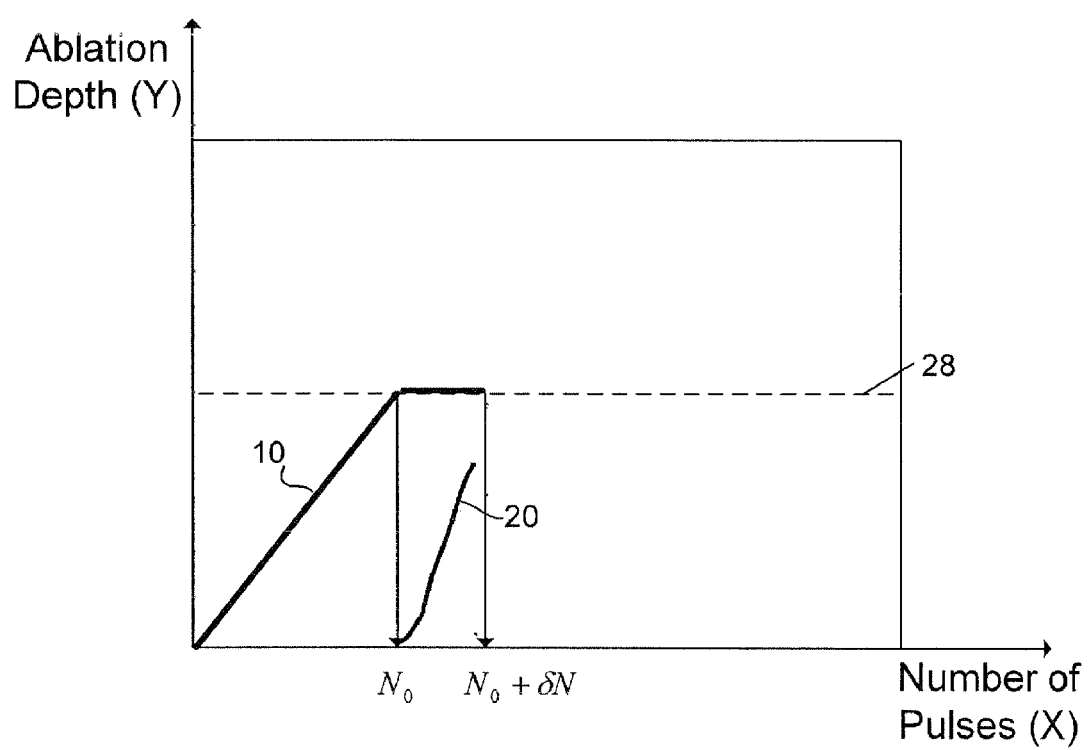
FIG. 7 shows the result of the method used in FIG. 6, in which the temperature of the underlying metal layer is significantly increased to reduce the number of pulses in its second series required to clean the metal.

FIG. 7 shows the result of the method used in FIG. 6, in which temperature 20 of underlying metal layer 16 surface is rapidly increased to reduce the number of pulses δV required to clean metal layer 16 once bulk resin material 14 is removed. This is a similarly favorable result as shown in FIG. 4, but which is obtained through the change of pulse width and peak power parameters of a subsequently pulsed beam propagating along the same beam path to clean underlying metal layer 16. As discussed, a fiber laser may be used to generate either or both of the first beam having wavelength $\lambda_1$ and the second beam having a shorter pulse width and higher peak power.

Figure 8A:
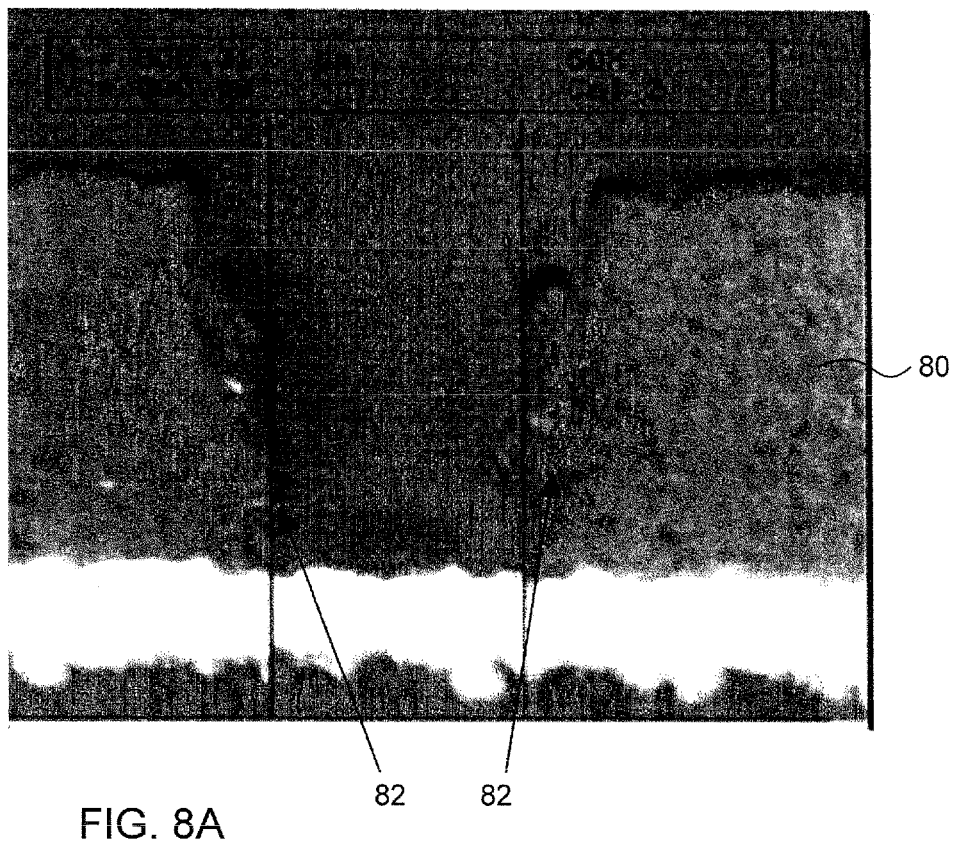
FIGS. 8A and 8B shows typical results after removing fiber-reinforced resin during beam drilling of a multilayered workpiece, leaving unwanted fiber protrusions.
Figure 8B:
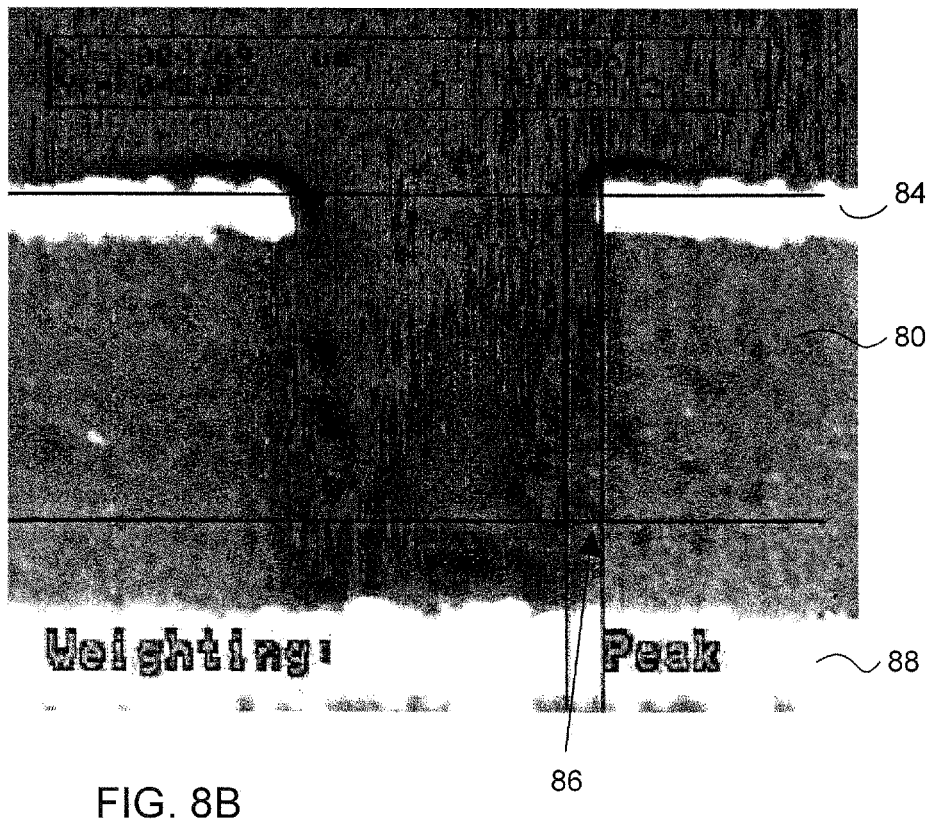

FIGS. 8A and 8B show typical results after removing fiber-reinforced resin 80 during drilling of a multilayered workpiece, leaving unwanted fiber protrusions 82. Examples of fiber-reinforced resin 80 include those commonly used in the printed wiring board (PWB) industry, such as glass cloth impregnated with one or more organic polymer resins sandwiched between conductive metal layers, typically copper. One class of this material configuration is commonly known as "FR4". Hybrid laser systems may utilize two lasers that provide laser beams of different wavelengths meant for processing FR4 or other copper laminated printed circuit boards (PCBs). A UV beam may penetrate a top copper (or metal) layer 84 followed by a $CO_2$ laser beam to remove fiber-reinforced resin 80 (or dielectric material) underneath copper layer 84. The length of fiber protrusion 86 isolated in FIG. 8B indicates obvious degradation of the quality of the via formed.

Process dimensions of micro devices, lead lines, vias, and through holes continue to shrink as the downsizing of digital commodities is required in today's ever-advancing electronics market. This trend affects the via size in PCB. $CO_2$ lasers are a dominant laser source for drilling vias in PCB of over 60 μm in diameter. Using a $CO_2$ laser, vias with diameters smaller than 60 μm start showing severe thermal side effects that result in poor process quality such as the shape of the blind via. The poor process quality could cause poor plating, and eventually a short circuit, in the final product. PCBs typically comprise a first conductive layer 84, a fiber-reinforced resin 80 as the dielectric, and a second, underlying, metal layer 88. The fiber has a large absorption for the $CO_2$ laser, which is why the latter is often used in processing PCB.

To meet the requirement of the smaller via, however, UV light source is usually used because it is less selective of the materials used for the dielectric layer 80 than a photovia process. Therefore, third harmonic generation (THG) from commercially available diode-pumped solid state lasers has became the industry standard. UV laser generation at 355 nm is, for instance, produced by THG from a commercially available Nd:YVO$_4$ or Nd:YAG laser. The absorption of 355 nm THG by fiber, however, is still so low that the quality of the via is generally unacceptable. FIGS. 8A and 8B show the cross section of a via drilled by a laser beam having a wavelength of 355 nm. The fourth harmonic generation (4HG) of the same laser generates a 266 nm wavelength.

Figure 9:
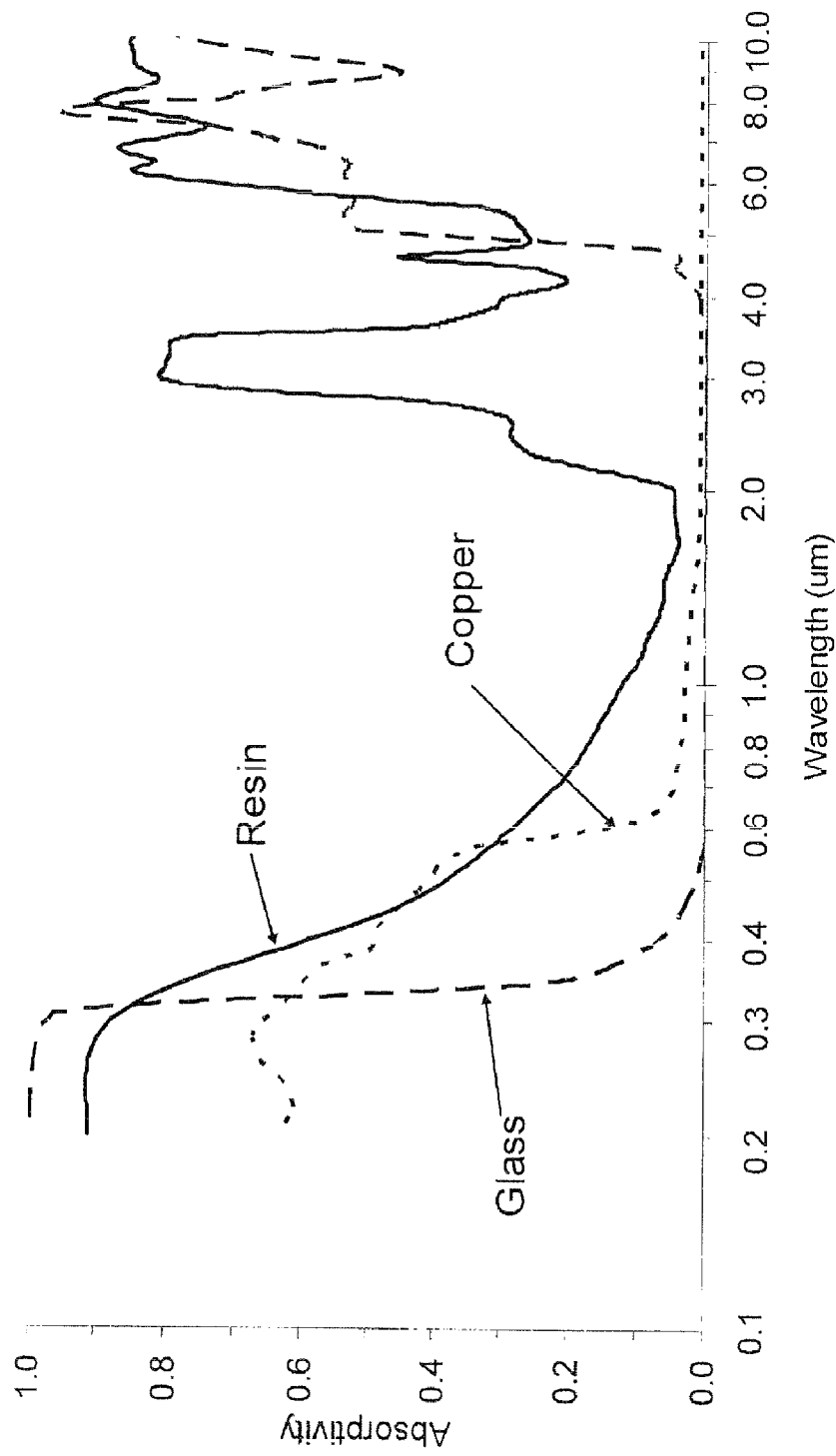
FIG. 9 shows absorption spectra of printed circuit board (PCB) materials.

FIG. 9 shows absorption spectra of printed circuit board (PCB) materials, including bulk resin 90, glass fiber 92 (most commonly used for PCB), and copper 94. The X-axis shows the wavelength of light in micrometers (μm), and the Y-axis shows a degree of absorption in arbitrary units (0 to 1). FIG. 9 shows the large absorption difference between resin 90 and glass fiber 92 at a process wavelength of 355 nm compared with that of 266 nm. Glass fiber 92 is almost transparent to 355 nm wavelength light, while resin 90 absorbs much more of the 355 nm wavelength light. However, as the wavelength becomes shorter to 266 nm, for example, the absorption of 266 nm by glass fiber 90 increases considerably. Undesired fiber protrusions 82, such as those shown in FIGS. 8A and 8B, are produced if the via is drilled with only a 355 nm wavelength light beam.

FIGS. 10A and 10B show diagrammatic depictions of fiber protrusions 82 left after removal of fiber-reinforced resin 80 by a laser having a 355 nm wavelength. To compensate for the low absorption by glass fiber 82, a high power 355 nm wavelength beam is used and the result is damage 100 to the bottom copper layer 88, as shown.

A top conductive layer 84 (FIGS. 12A and 12B) generally comprises a thin layer of copper. Because of the high reflectivity of a $CO_2$ laser beam, a special surface treatment is used for the $CO_2$ laser beam to penetrate the copper layer to form the blind via. On the other hand, a 355 nm laser has much higher absorption without any need of the surface treatment.

An alternative way to prevent fiber 82 protrusions when a via is formed at a single wavelength is to drill the blind via with use of multiple laser beams of different wavelengths, alternately or simultaneously, to improve the process quality as well as the throughput of PCB processing. During the process of material removal, the laser beams are in motion by a beam steering device such as linear stages and/or galvanometers as are known and used in the art. Alternately, a dual-wavelength hybrid laser beam may be used while alternately pulsing with 355 nm and 266 nm wavelength laser beams.

Figure 11A:
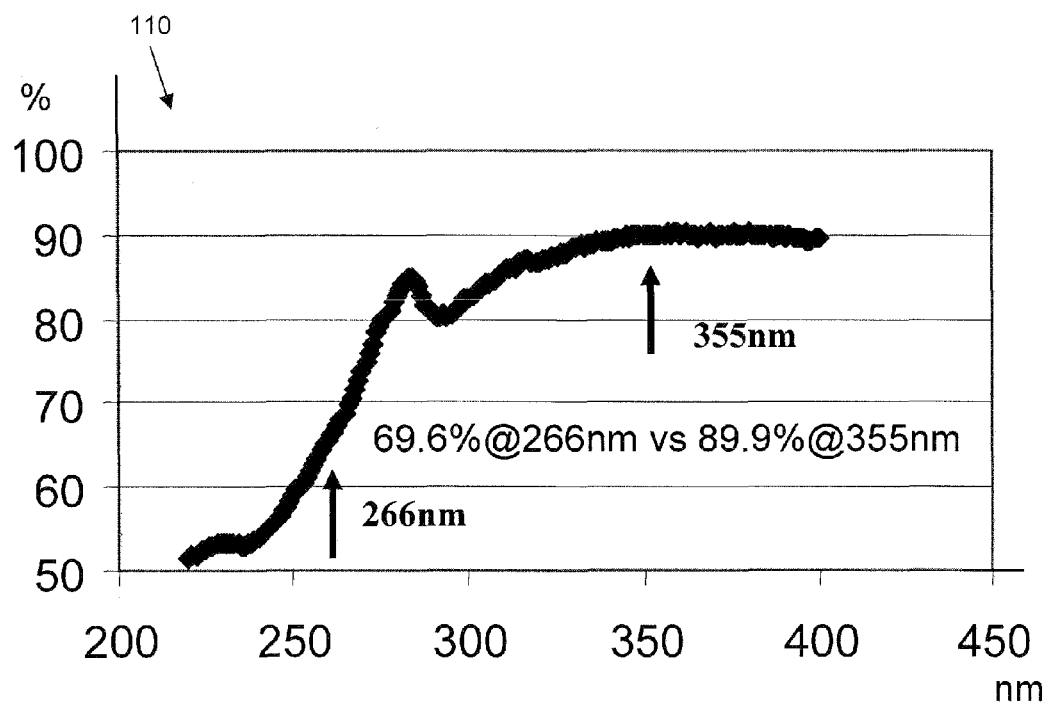
FIG. 11A shows a transmission spectrum of glass cloth, representative of the transmission of the fiber protrusions of FIGS. 8A, 8B, 10A, and 10B.

FIG. 11A shows a transmission spectrum 110 of glass cloth, representative of the transmission of fibers 82 of FIGS. 8A, 8B, 10A, 10B, 12A, and 12B. The horizontal axis includes wavelength in nanometers (nm), and the vertical axis shows the percentage of light transmission for glass cloth along the spectrum of laser light. As previously mentioned, the glass cloth (or glass fiber 82) is largely transmissive (90%) of the 355 nm wavelength light. However, the glass cloth transmits only about 70% of the 266 nm light, thereby absorbing about 30% of it, a significant difference from the 10% absorption of the 355 nm wavelength light.

Figure 11B:
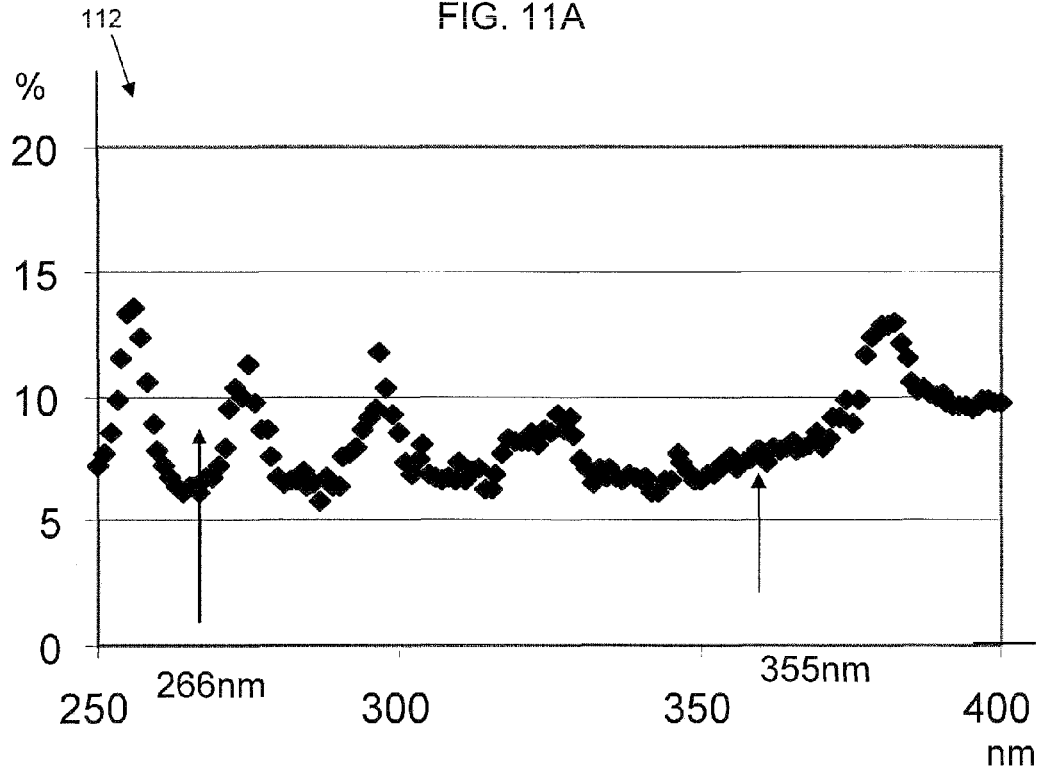
FIG. 11B shows a reflection spectrum of shiny copper, a typical material used in metal pads of blind vias.

FIG. 11B shows a reflection spectrum 112 of shiny copper, typically used in metal pads 86 of vias. The reflection spectrum 112 shows that there is little difference in reflection between laser light wavelengths of 355 nm and 266 nm. Because less power is required to process glass with 266 nm as compared to with that of 355 nm, damage to bottom copper layer 86 can be reduced by using the 266 nm wavelength, which also more favorably removes glass fiber 82.

Figures 12A, 12B:
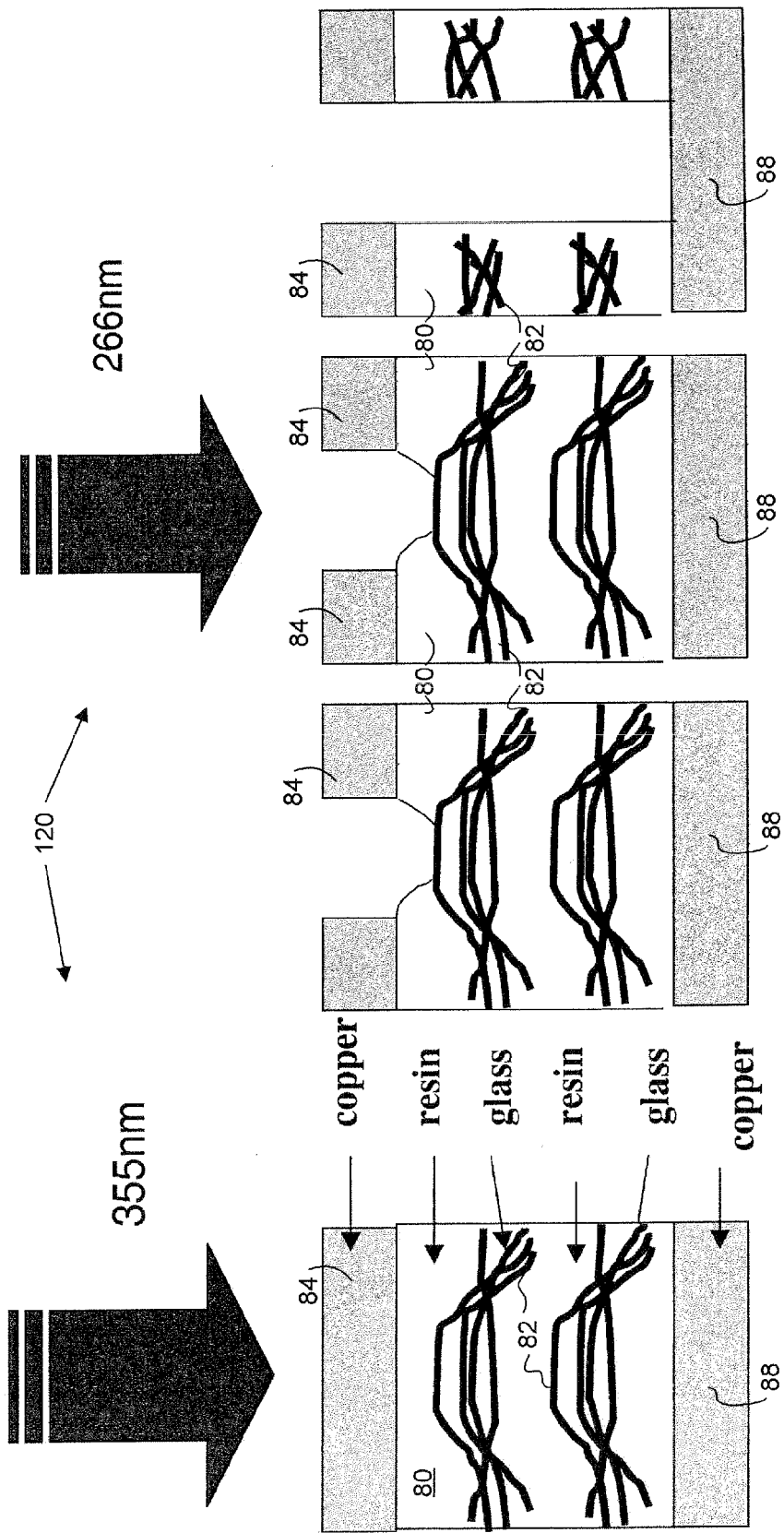
FIGS. 12A and 12B show the results of drilling a blind via in a multilayer target material that uses a hybrid laser beam having, respectively, a 355 nm wavelength component to drill through a first copper layer, and a 266 nm harmonic wavelength component to pass through the opening in the first copper layer and thereafter drill through the fiber-reinforced resin without damaging an underlying second copper layer.

FIGS. 12A and 12B show the results of drilling a via in a multilevel target material 18, such as PCB, with a hybrid laser beam 120. Hybrid beam 120 may include a 355 nm wavelength to drill through a first copper layer 84, and a 266 nm wavelength to drill through the fiber-reinforced resin 80/82 without damaging underlying second metal layer 88. A first step, therefore, may be to drill through the first copper layer 84 with a commercial higher power THG (355 nm) wavelength laser beam. The fourth harmonic laser beam (4HG) of 266 nm may then be used to remove the fiber-reinforced resin 80/82, or dielectric layer, in a second step with minimum copper damage to the second metal layer 88. The fourth harmonic wavelength is commercially produced currently, or it may be generated through various optical processing elements employed with the solid state laser that is commercially produced. Embodiments of such laser generation will be discussed in detail below.

Figure 13:
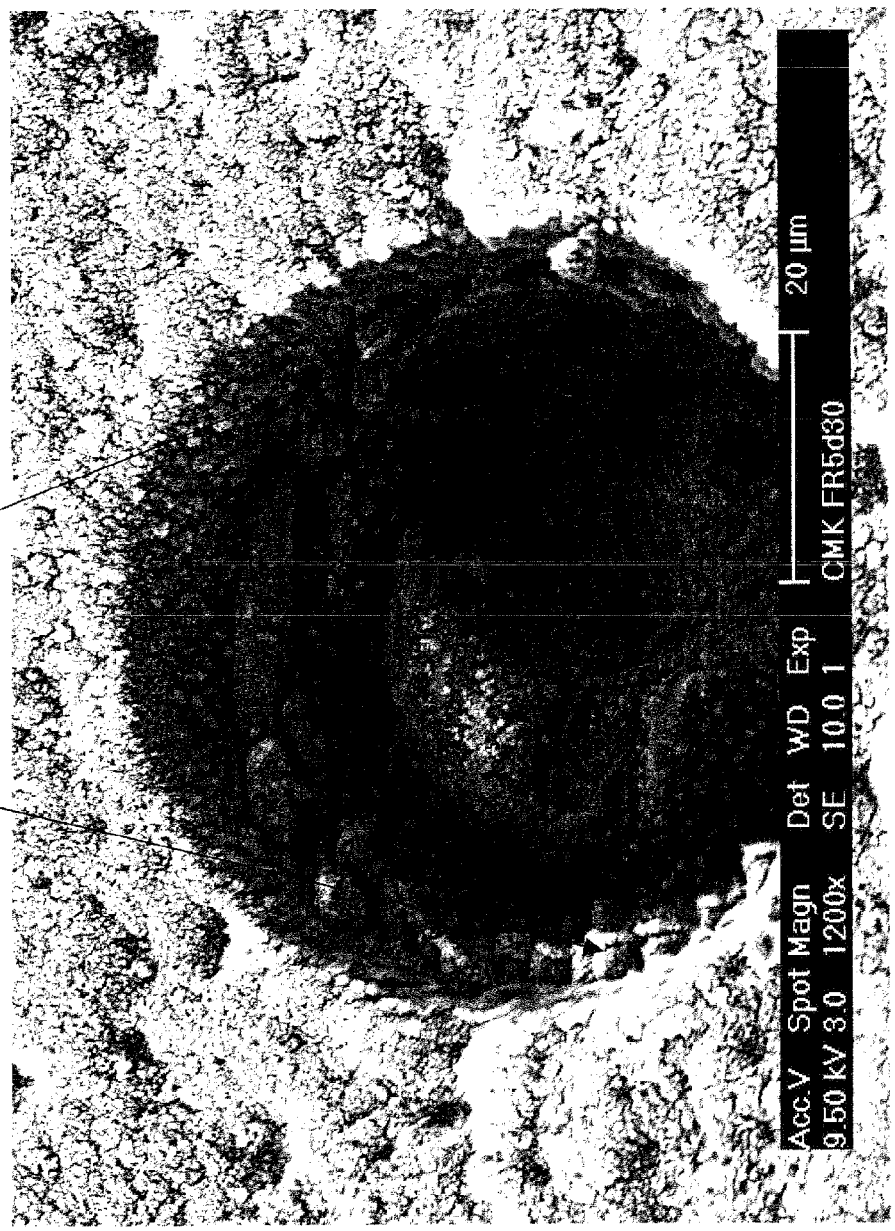
FIG. 13 shows a plan view of sharply cut fibers in the sidewalls of a drilled blind via using the method of FIGS. 12A and 12B.

FIG. 13 shows sharply cut fibers in a drilled via using the method of FIGS. 12A and 12B. The steepness of the via walls and the minimization of protruding fibers in those walls are apparent.

FIGS. 14A, 14B, 14C, and 14D show various implementations of laser systems generating two laser output beams of varying wavelengths from a single laser of a fundamental wavelength. Although the specifics taught in these drawing figures may be to generate both 355 nm and 266 nm UV light, a skilled person will appreciate that different harmonics may be used with a different fundamental wavelength to generate different sets of dual wavelength laser beams.

Figure 14A:
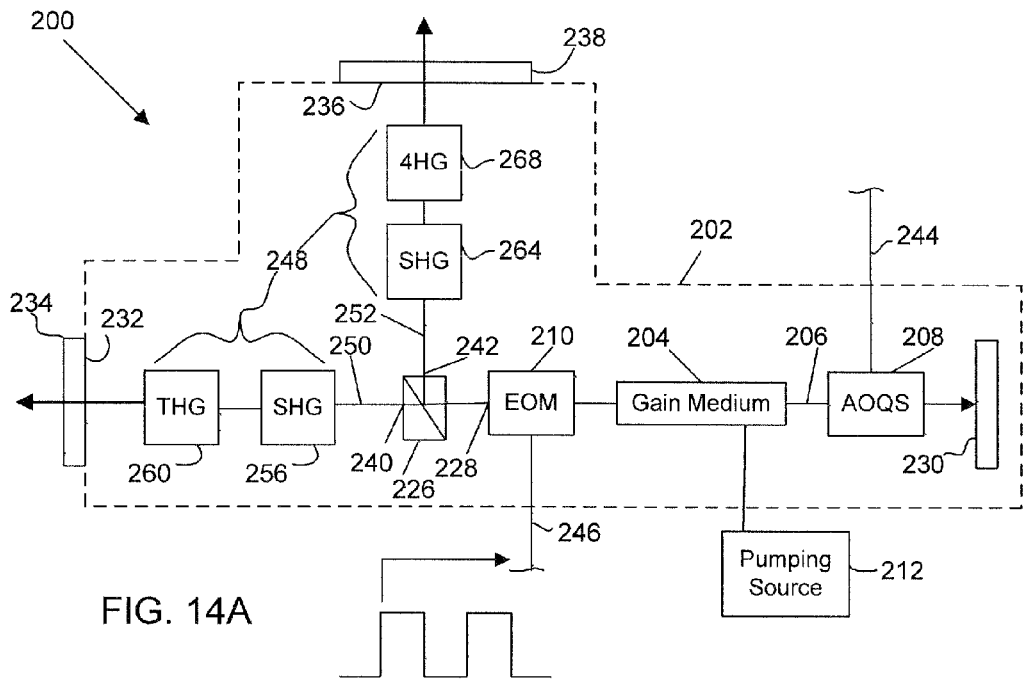
FIGS. 14A, 14B, 14C, and 14D show various implementations of a laser system for generating, from a single laser resonator, two output beams of different wavelengths.

FIG. 14A is one embodiment of a laser system 200 for generating both third harmonic (THG) and fourth harmonic (4HG) wavelengths. System 200 is configured to implement intracavity light beam multiplexing that provides selectively either alternately or concurrently two output beams of polarization state-modulated light emission pulses. Laser system 200 includes a laser resonator 202 in which a gain or lasing medium 204 is positioned along a beam path 206 between an acousto-optical Q-switch (AOQS) 208 and a variable optical retarder 210. Variable optical retarder 210 functions as a fast-steering mirror that adjusts the polarization direction of a laser beam passing therethrough. A pumping source 212 that is optically associated with lasing medium 204 provides pumping light to stimulate a lasing gain of lasing medium 204.

Lasing medium 204 may include a conventional solid-state lasant such as Nd:YAG, Nd:YLF, Nd:YVO$_4$, or Yb:YAG, making available all of their laser wavelengths as well as the harmonics thereof. In some embodiments, lasing medium 204 is pumped from the side by one or more diodes or diode arrays (not shown). Skilled persons will also appreciate that one or more amps, lasers, or other pumping devices could be employed to provide the pumping light and that lasing medium 204 could alternatively employ a different type of lasing medium such as a gas, $CO_2$, excimer, or copper vapor lasing medium.

A light polarizing beamsplitter 226 is positioned at an output 228 of variable optical retarder 210. The laser resonator effectively establishes two laser cavities, the first of which is defined by a rear mirror 230 and an intracavity dichroic mirror 232 of a first output coupler 234 from which a first output beam propagates, and the second of which is defined by rear mirror 230 and an intracavity dichroic mirror surface 236 of a second output coupler 238 from which a second output beam propagates. Dichroic mirror surfaces 232 and 236 receive incident light propagating from the respective outputs 240 and 242 of light polarizing beamsplitter 226.

AOQS 208 changes the Q value of the laser resonator in response to an applied Q-switch drive signal 244 by selectively producing high and low Q states of the laser resonator. The high Q state causes production of multiple time-displaced light pulses, and the low Q state causes production of no or very low intensity residual light pulses.

Laser system 200 is configured to maintain oscillation in laser resonator 202 even when an output beam is extracted from a laser cavity. If lasing medium 204 is of isotropic type, such as Nd:YAG, oscillation in laser resonator 202 is maintained even when variable optical retarder 210 causes a polarization state change by 90 degrees. If lasing medium 204 is of anisotropic type, such as a YLF or YVO$_4$ (vanadate), the gains for the two orthogonal polarization states differ and thereby jeopardize sustenance of stable oscillation. To operate with anisotropic lasing media, a second lasing medium (not shown) of the same type is introduced in the laser resonator in orthogonal orientation relative to lasing medium 204 so that the two orthogonal polarizations states do not affect cavity gain.

The operation of variable optical retarder 210 determines the production of the first and second output beams propagating from output couplers 234 and 238. Whenever a drive signal 246 applied to variable optical retarder 210 causes it to impart one-quarter wave retardation to incident light, circularly polarized light propagates from output 228, is directed by polarizing beamsplitter 226 to dichroic mirror surfaces 232 and 236, and exits concurrently as separate beam components of the fundamental wavelength from output couplers 234 and 238. Whenever drive signal 246 applied to variable optical retarder 210 causes it to alternately impart zero and one-half wave retardation (or similar multiple of one-half wave retardation) to incident light, a linearly polarized light beam propagates from output 228, is directed by polarizing beamsplitter 226 to dichroic mirror surfaces 232 and 236, and exits alternately from output couplers 234 and 238. The various states of drive signal 246 described above are applicable to laser resonator 202, irrespective of whether it contains lasing medium 204 of isotropic or anisotropic type. Drive signal 246 represents information derived from a tool path file residing in a processing system (not shown) and is delivered to variable optical retarder 210 by a pulse generator (not shown) as a pulsed waveform.

To produce dual-wavelengths from outputs 240 and 242, respectively, of polarizing beam splitter 226, various intracavity wavelength converters 248 may be employed in respective beam paths 250 and 252 before the respective laser beams exit laser resonator 202. Wavelength converters 248 may include a non-linear crystal, such as KTP (potassium titanium oxide phosphate, KTiOPO4), BBO (beta barium borate, beta-BaB2O4), and LB (lithium triborate, LiB3O5), for laser wavelength conversion. Typical fundamental laser wavelengths include, but are not limited to, 1064 nm, which has harmonic wavelengths at 532 nm (frequency doubled), 355 nm (frequency tripled), 266 nm (frequency quadrupled), and 213 nm (frequency quintupled). As wavelength converters 248 are positioned intra-cavity, laser beams of high intensity can be produced.

Specifically, laser beam output 240 may pass through a second harmonic generation (SHG) converter 256 to produce a second harmonic wavelength (532 nm). The second harmonic beam may then pass through a third harmonic generation (THG) converter 260 to produce a third harmonic wavelength (355 nm) laser beam, which exits through output coupler 234. Furthermore, laser beam output 242 may pass through a SHG converter 264 to produce a second harmonic wavelength (532 nm) and further through a fourth harmonic generation converter (4HG) 268 to produce a laser beam of a fourth harmonic wavelength (266 nm) before exiting through output coupler 238.

Figure 16:
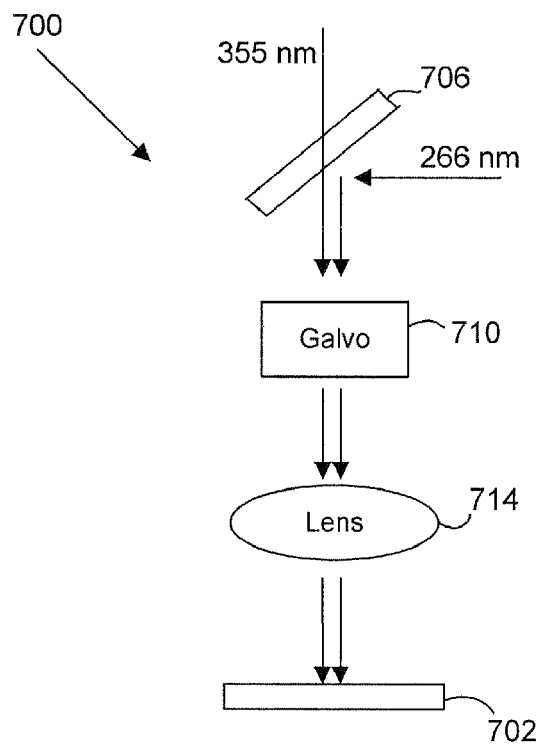
FIG. 16 shows an optical system that enables dual-wavelength laser beams, such as those generated as shown in FIGS. 14A-14D and 15, to be combined into a collinear, hybrid laser processing beam for delivery to a work surface.

Laser system 200 may, therefore, produce laser processing outputs of both 355 nm and 266 nm wavelengths, as desired to implement the above increased quality of drilled vias. Although laser system 200 produces the two desired wavelengths $\lambda_1$, $\lambda_2$ discussed herein, the laser beams do not exit the laser cavity as a hybrid laser beam. FIG. 16 shows one way to coaxially combine the two laser beams through additional optical elements employed after the laser cavity.

Figure 14B:
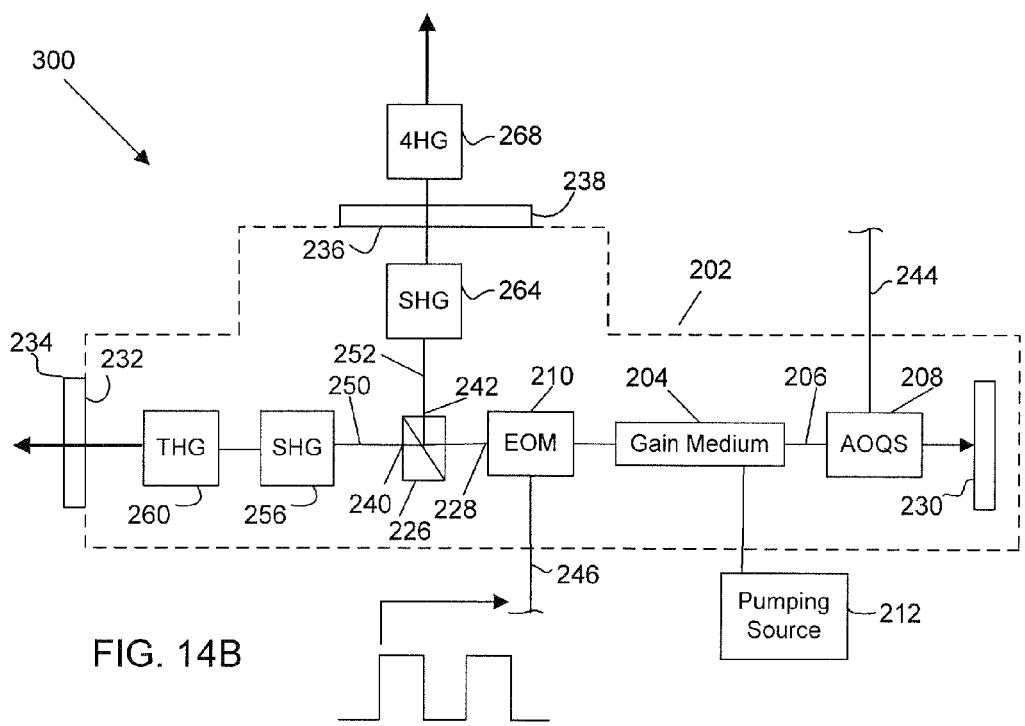
Figure 14C:
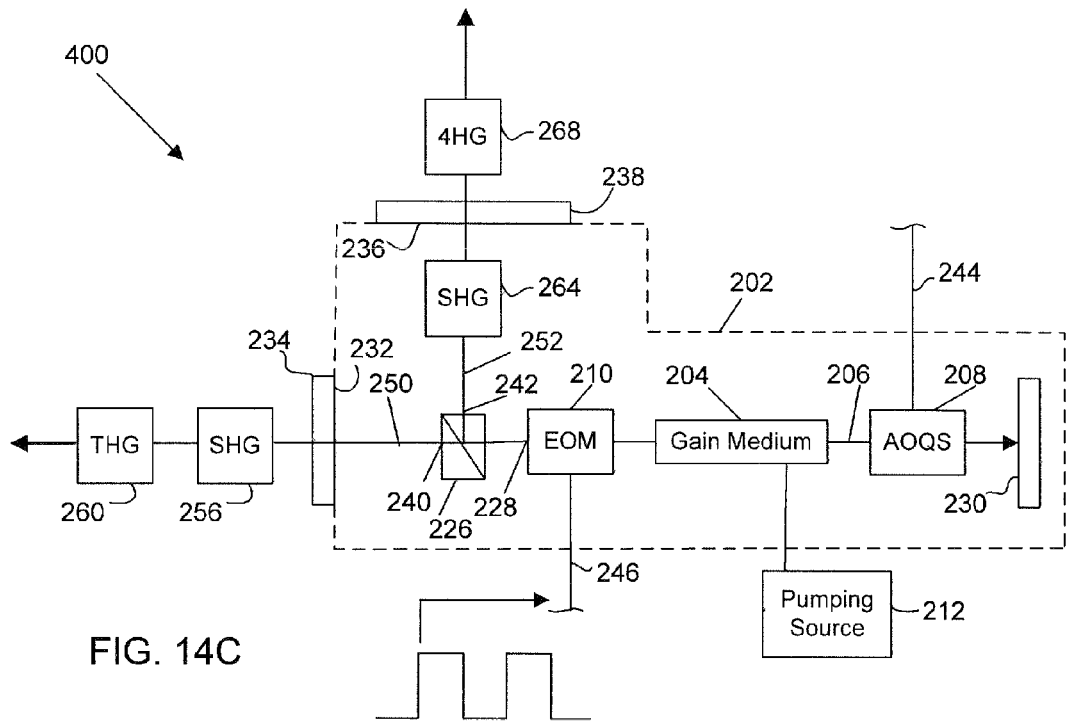
Figure 14D:
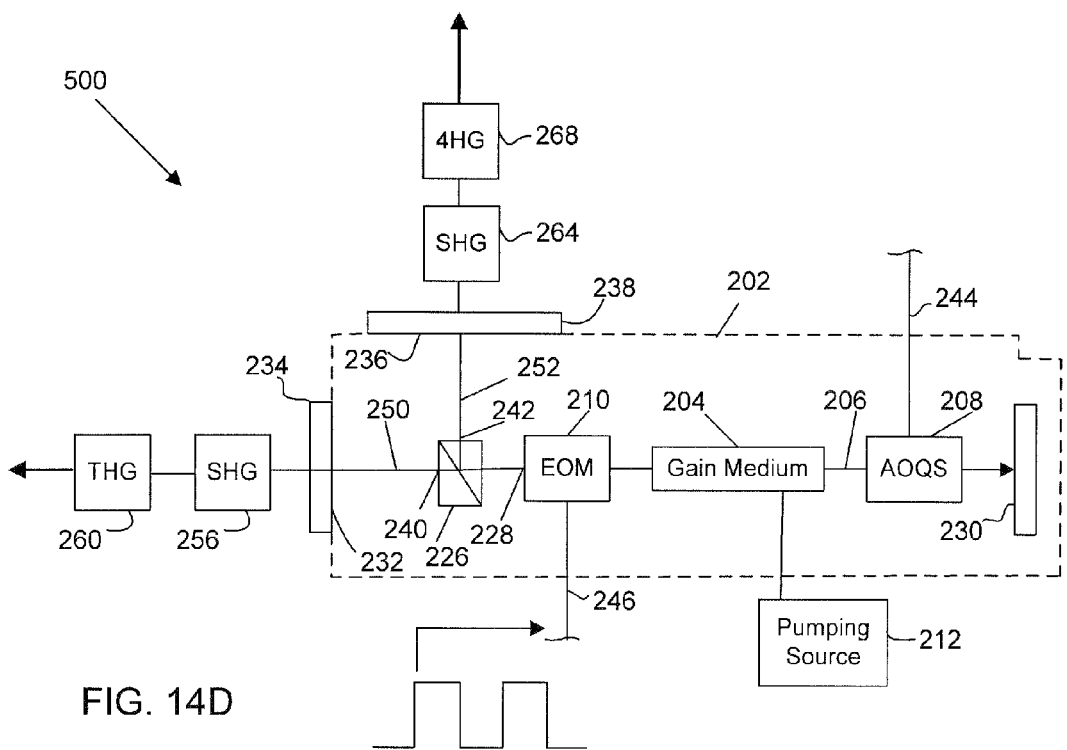

FIGS. 14B, 14C, and 14D present variations 300, 400, and 500, respectively, of laser system 200 of FIG. 14A, showing various wavelength converters 248 being moved to extracavity locations. Moving the non-linear crystals outside of laser resonator 202 may be desirable for a laser processing beam of a shorter pulse width, although the resultant laser beam typically also has less intensity. For instance, FIG. 14B shows 4HG converter 268 located outside of output coupler 238. This advantageously produces a UV or green processing laser beam of shorter pulse width. In addition, in FIG. 14C, SHG converter 256 and THG converter 260 are also located outside the cavity. This implementation advantageously further provides a UV laser processing beam of lower intensity to perhaps be used to ablate more fragile dielectric material. FIG. 14D further displays the implementation of FIG. 14C, but with all the wavelength converters 248 located outside of the laser cavity. FIG. 14D thus displays one way that a basic laser of fundamental wavelength having an electro-optic modulator 210 may be converted, with the addition of extracavity wavelength converters 248, to a dual-wavelength beam generator comprising the desired harmonics in the two laser beam outputs, thus reducing cost.

Figure 15:
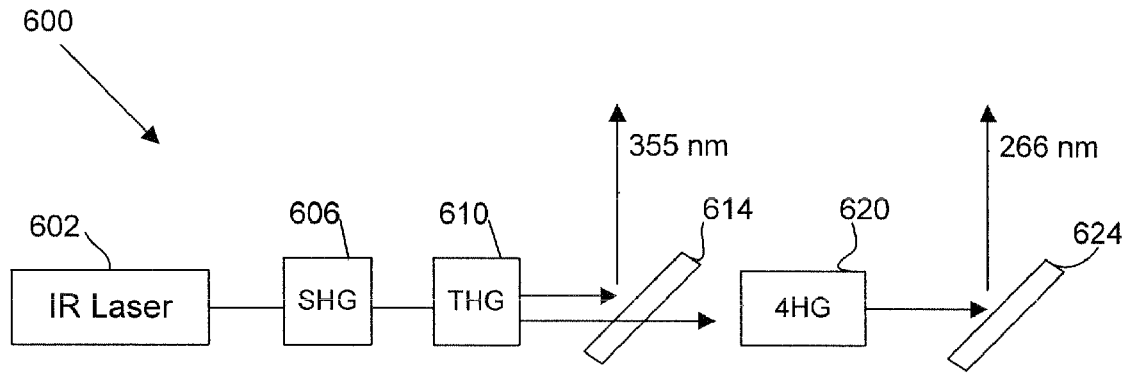
FIG. 15 shows a laser system for generating, from an IR laser, two laser beams at different wavelengths.

FIG. 15 shows a laser system 600 for generating dual-wavelengths from an IR laser 602 having Nd:YAG or Nd:YVO4 lasant. A SHG converter 606 converts the fundamental wavelength (1064 nm) from laser 602 to a 532 nm second harmonic wavelength. A THG converter 610 converts the 532 nm harmonic to a third harmonic of 355 nm. A dichroic mirror 614 selectively reflects the 355 nm wavelength light and transmits unconverted (or residual) 532 nm wavelength light. A 4HG converter 620 then converts the 532 nm wavelength light into a fourth harmonic of 266 nm, which is reflected off of a mirror 624 in the same direction as the 355 nm laser beam. In this fashion, both 355 nm and 266 nm wavelengths are formed, which may then be combined into a hybrid beam comprised of two coaxially propagated laser beams having different wavelengths. Although specific wavelengths are cited, a laser 602 of a different fundamental wavelength may produce laser processing outputs of varying harmonic wavelengths.

FIG. 16 shows an optical system 700 that enables dual-wavelength laser beams, such as those generated by laser systems 200, 300, 400, 500, and 600, to be combined into a collinear, hybrid laser processing beam for delivery to a work surface 702. Optical system 700 may cause the two laser beams to be irradiated simultaneously or alternately. For instance, a 355 nm wavelength laser beam may be transmitted by a dichroic mirror 706 while a 266 nm wavelength laser beam is reflected off the dichroic mirror 706 in a collinear direction with the 355 nm wave-length laser beam. The direction of reflection off, or transmission through, the mirror 706 for each of the 355 nm or 266 nm wavelengths may, of course, be alternated depending on the optical properties of a given dichroic mirror 706. Dichroic mirror 706 may also include a beam combiner to aid in producing a single beam of the two laser beams. The collinearly propagated laser beams are then passed through a galvanometer scanner 710 having a pair of controlled mirrors (not shown), through a dual beam Fθ lens 714, and onto work surface 702 having a target material for processing. Galvanometer scanners 710 may be electronically controlled to sense and direct the two beams of different wavelengths to a common target location on the target material.

Figure 17:
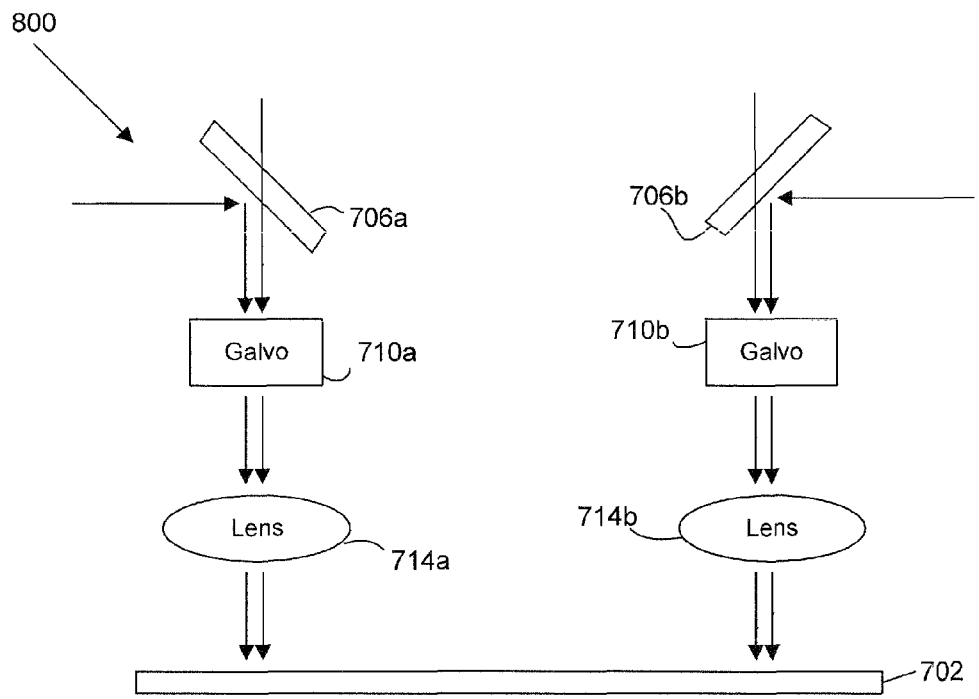
FIG. 17 shows an optical system for generating a set of dual-wavelength laser beams using multiple processing heads, thus providing laser processing to multiple locations on a target material.

FIG. 17 shows an optical system 800 for generating a set of dual-wavelength laser beams using multiple processing heads (or sets of optical processing elements such as system 700), thus providing laser processing to two locations on a work surface 702. For example, first and second dichroic mirrors, 706a and 706b, may each selectively reflect a first wavelength and transmit a second wavelength. The laser beams of the first and second wavelengths may be provided by a single laser whose beam is first split into two laser beams and processed to include different wavelengths, or may be supplied by two different lasers that generate beams of different wavelengths.

As in FIG. 16, each first and second pairs of laser beams pass through respective galvanometer scanners 710a and 710b and then through respective dual beam Fθ lenses 714a and 714b, thereby combining two sets of laser beams of different wavelengths into a pair of hybrid laser processing outputs. The result is twice the processing in the same time period, enhanced by a reduced number of pulses required to drill via or through-holes as taught herein, and where UV, IR, and/or green laser processing beams may be pulsed simultaneously at multiple target material locations.

Additionally, optical system 800 may be implemented to propagate to work surface 702a 355 nm wavelength laser beam in a first location followed by a 266 nm wavelength laser beam in a second location, for instance. Optical system 800 could likewise include a pair of galvanometers (not shown) to move a target material on work surface 702 in between pulsing the two wavelengths, to thereby implement the methods taught in FIGS. 11-13. A skilled person will appreciate that the optical system 800 of FIG. 17 may combine a dual-wavelength beam through one set of optical processing elements while a single-wavelength beam passes through the second set of optical processing elements.

Figure 18:
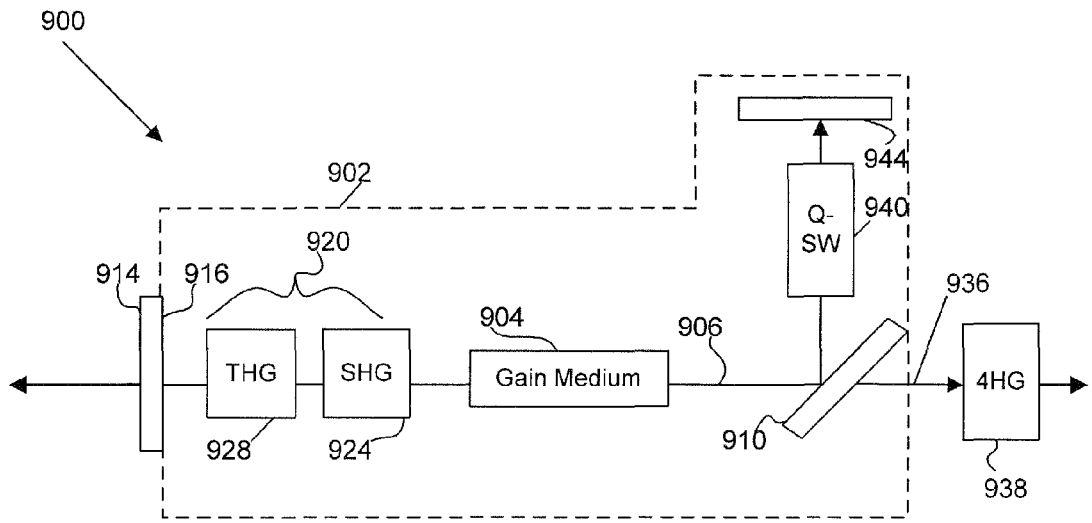
FIG. 18 shows an optical system for generating, without the use of an electro-optical device, dual-wavelength laser beams from a single laser source having a fundamental wavelength.

FIG. 18 shows a laser system 900 for generating dual-wavelength laser beams from a single laser source having a fundamental wavelength, but without the use of an electro-optical device. Laser system 900 includes a laser resonator 902 in which a gain or lasing medium 904 is positioned along a beam path 906 between a dichroic mirror 910 and an output coupler 914 having a dichroic mirror surface 916. Oscillation is set up in the laser resonator 902 in which one or more wavelength converters 920 may be located in the beam path 906 before the laser beam exits the output coupler 914.

For instance, a SHG converter 924 may be positioned to receive a laser beam having a fundamental wavelength generated by lasing medium 904 and convert the laser beam to a second harmonic. A THG converter 928 may further be positioned to receive the second harmonic laser beam generated by SHG converter 924 and to generate a third harmonic laser beam, such as of a 355 nm wavelength. Dichroic mirror 916 of output coupler 914 allows the third harmonic laser beam to exit from one end of resonator 902. Unconverted fundamental and second harmonic wavelength light reflects off of dichroic mirror surface 916 and is returned down resonator 902, incident upon dichroic mirror 910. Dichroic mirror 910 transmits the second harmonic light, which exits resonator 902 at output 936, and reflects the fundamental wavelength light. A 4HG converter 938 may be positioned at output 936 of resonator 902 to convert the transmitted second harmonic wavelength light into a fourth harmonic (e.g. 266 nm) output processing beam.

The reflected fundamental laser beam from dichroic mirror 910 is processed by a Q-switch 940 and reflected back into the beam path 906 by a rear mirror 944, thereby generating the desired Q state in laser resonator 902 to produce the fundamental wavelength of light emission pulses leaving Q-switch 940. Note also that a pumping source (not shown) and a Q-switch 940 drive signal (not shown) may be included, as discussed with reference to FIGS. 14A to 14D.

It will be obvious to those having skill in the art that many changes may be made to the details of the above-described embodiments of this disclosure without departing from the underlying principles thereof. The scope of the present invention should, therefore, be determined only by the following claims.

The invention claimed is:

1. A system configured to generate from a single laser source two pulsed output beams of different wavelengths, comprising:
    a laser resonator characterized by a Q value, the resonator including a mirror and first and second wavelength selective mirror surfaces of respective first and second output couplers, the mirror and the first wavelength selective mirror surface and the mirror and the second wavelength selective mirror surface establishing respective first and second laser cavities within the laser resonator;
    a pumping source optically associated with a lasing medium residing in the laser resonator, the pumping source providing pumping light to stimulate a lasing gain of the lasing medium at a fundamental wavelength;
    a Q-switch positioned within the laser resonator and operating to change the Q value of the laser resonator in response to a Q-switch drive signal selectively producing high and low Q states of the laser resonator, the high and low Q states producing a beam of multiple time-displaced light emission pulses characterized by a light polarization state;
    a variable optical retarder positioned within the laser resonator and responding to an optical retarder drive signal to impart selected amounts of optical retardation to the beam of light emission pulses, the selected amounts of optical retardation imparted by the variable optical retarder selectively changing the light polarization state of the beam of light emission pulses to produce polarization state-modulated light emission pulses; and
    a polarization sensitive beam splitter positioned within the laser resonator and cooperating with first and second wavelength converters to receive the polarization state-modulated light emission pulses and direct them through, respectively, the first wavelength selective mirror surface of the first laser cavity as a first output beam at a first wavelength and the second wavelength selective mirror surface of the second laser cavity as a second output beam at a second wavelength in accordance with the selected amounts of retardation imparted by the variable optical retarder to the light emission pulses, the first and second wavelengths being harmonically related to the fundamental wavelength as converted by the first and second wavelength converters.

2. The system of claim 1, wherein the first and second wavelength selective mirror surfaces are, respectively, first and second intracavity dichroic mirror surfaces that reflect one and transmit the other one of the first and second output beams at respective first and second wavelengths.

3. The system of claim 1, in which the drive signal causes the variable optical retarder to impart a difference of one-half wavelength for the selected amounts of optical retardation.

4. The system of claim 3, in which one of the selected amounts of optical retardation represents a multiple of one-quarter wavelength and the polarization state-modulated light emission pulses propagate concurrently through the first and second output couplers.

5. The system of claim 3, in which one of the selected amounts of optical retardation represents a multiple of one-half wavelength and the polarization state-modulated light emission pulses propagate at a given time through one or the other of the first and second output couplers.

6. The system of claim 1, in which the first wavelength converter is located along a first beam path and comprises:
    a first second harmonic generator (SHG); and
    a third harmonic generator (THG) to receive an output from the SHG, to generate a third harmonic wavelength in the first output beam.

7. The system of claim 6, in which the second wavelength converter is located along a second beam path and comprises:
    a second SHG; and
    a fourth harmonic generator (4HG) to receive an output from the SHG, to generate a fourth harmonic wavelength in the second output beam.

8. The system of claim 7, in which:
    the 4HG is positioned outside the laser resonator along the second beam path to receive an output from the second output coupler and to convert the output to the second output beam at a fourth harmonic wavelength;
    the second SHG is positioned outside the laser resonator along the second beam path to receive the output from the second output coupler, and to transmit the output through the 4HG; and
    the first SHG and the THG are positioned in series outside the laser resonator along the first beam path, the first SHG positioned between the first output coupler and the THG.

9. The system of claim 1, further comprising a set of optical processing elements to combine the first and second output beams at respective first and second wavelengths traveling orthogonally to each other into a dual-wavelength laser beam, the set of optical processing elements comprising:
    a dichroic mirror transmissive to one of the first and second output beams at respective first and second wavelengths and reflective of the other of the first and second output beams at respective first and second wavelengths, to direct the first and second output beams into a collinear path, thereby forming a dual-wavelength laser beam;
    a beam scanner to direct the dual-wavelength laser beam onto a designated location of a target material; and
    a Fθ lens through which the dual-wavelength laser beam passes before contacting the target material location.

10. A system configured to generate from a single laser source two pulsed output beams of different wavelengths, comprising:
    a pumping source optically associated with a lasing medium residing in a laser resonator characterized by a Q value, the pumping source providing pumping light to stimulate a lasing gain of the lasing medium at a fundamental wavelength;
    a Q-switch positioned within the laser resonator and operating to change the Q value of the laser resonator in response to a Q-switch drive signal selectively producing high and low Q states of the laser resonator, the high and low Q states producing a beam of multiple time-displaced light emission pulses reflected from a rear mirror;
    a dichroic mirror positioned within the resonator to reflect the light emission pulses between the rear mirror and an output coupler having a second dichroic mirror surface that selectively transmits third harmonic light emission pulses, and wherein the dichroic mirror selectively transmits second harmonic light emission pulses that exit the laser resonator;

a second harmonic generation (SHG) converter positioned between the dichroic mirror and the output coupler to produce second harmonic light emission pulses;

a third harmonic generation (THG) converter positioned at the output of the SHG converter to produce third harmonic light emission pulses that pass through the output coupler, wherein unconverted second harmonic light emission pulses reflect off of the second dichroic mirror surface and pass through the dichroic mirror; and a fourth harmonic generation (4HG) converter positioned at the output of the laser resonator to receive the exiting second harmonic light emission pulses and convert them into fourth harmonic light emission pulses, wherein the exiting third harmonic light emission pulses comprise a first output beam at a first wavelength, and the exiting fourth harmonic light emission pulses comprise a second output beam at a second wavelength.

11. The system of claim 10, further comprising a set of optical processing elements to combine the first and second output beams at respective first and second wavelengths traveling orthogonally to each other into a dual-wavelength laser beam, the set of optical processing elements comprising:

a multiple beam-directing dichroic mirror transmissive to one of the first and second output beams at respective first and second wavelengths and reflective of the other of the first and second output beams at respective first and second wavelengths, to direct the first and second output beams into a collinear path, thereby forming a dual-wavelength laser beam;

a beam scanner to direct the dual-wavelength laser beam onto a designated location of a target material; and a Fθ lens through which the dual-wavelength laser beam passes before contacting the target material location.

* * * * *